(12) United States Patent
Shirouzu et al.

(10) Patent No.: US 8,665,251 B2
(45) Date of Patent: Mar. 4, 2014

(54) DISPLAY DEVICE AND METHOD OF MANUFACTURING THE SAME

(75) Inventors: Hiroshi Shirouzu, Shiga (JP); Kenichi Tajika, Kyoto (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 13/295,471

(22) Filed: Nov. 14, 2011

(65) Prior Publication Data
US 2012/0056538 A1 Mar. 8, 2012

Related U.S. Application Data

(63) Continuation of application No. PCT/JP2010/003235, filed on May 13, 2010.

(51) Int. Cl.
*G06F 3/038* (2013.01)

(52) U.S. Cl.
USPC ............... 345/204; 345/76; 345/82; 438/29; 257/88; 257/59; 257/71; 313/506; 313/463; 315/169.3

(58) Field of Classification Search
USPC .......... 345/74.1, 76–77, 80, 82–83, 204–205; 313/506–507, 463; 315/51, 71, 169.3; 257/59, 71, 79, 88; 438/29
See application file for complete search history.

(56) References Cited

U.S. PATENT DOCUMENTS

| | | | |
|---|---|---|---|
| 6,753,935 B2 * | 6/2004 | Wu | 349/54 |
| 7,430,024 B2 | 9/2008 | Yagi et al. | |
| 7,812,893 B2 | 10/2010 | Yagi et al. | |
| 7,830,467 B2 | 11/2010 | Yagi et al. | |
| 7,839,077 B2 | 11/2010 | Kim | |
| 8,089,477 B2 | 1/2012 | Shirouzu et al. | |
| 2005/0162893 A1 | 7/2005 | Yagi et al. | |
| 2007/0046186 A1 | 3/2007 | Kim | |
| 2008/0309841 A1 * | 12/2008 | Yagi et al. | 349/54 |
| 2009/0073335 A1 | 3/2009 | Yagi et al. | |
| 2010/0214273 A1 | 8/2010 | Shirouzu et al. | |
| 2011/0012880 A1 * | 1/2011 | Tanaka et al. | 345/211 |
| 2011/0025937 A1 * | 2/2011 | Yagi et al. | 349/39 |

FOREIGN PATENT DOCUMENTS

| | | |
|---|---|---|
| JP | 2001-056652 | 2/2001 |
| JP | 2001-330850 | 11/2001 |
| JP | 2005-242307 | 9/2005 |
| JP | 2007-066904 | 3/2007 |
| JP | 2008-203636 | 9/2008 |
| JP | 2009-139699 | 6/2009 |
| WO | 2006/054386 | 5/2006 |

* cited by examiner

*Primary Examiner* — Lun-Yi Lao
*Assistant Examiner* — MD Saiful A Saddiqui
(74) *Attorney, Agent, or Firm* — Greenblum & Bernstein, P.L.C.

(57) ABSTRACT

The display device includes stacked layers including a display element layer and a control layer including a capacitor including an upper electrode layer and a lower electrode layer that face each other in a layer-stacking direction, wherein the upper electrode layer includes a first upper capacitor electrode connecting two circuit elements, a disconnectable portion, and a second upper capacitor electrode connected to the first upper electrode layer through the disconnectable portion, and the lower electrode layer includes a first lower capacitor electrode connecting two circuit elements, a disconnectable portion, and a second lower capacitor electrode connected to the first lower electrode layer through the disconnectable portion. The capacitor has a capacitance each between the first upper capacitor electrode and the second lower capacitor electrode, and the first lower capacitor electrode and the second upper capacitor electrode.

12 Claims, 11 Drawing Sheets

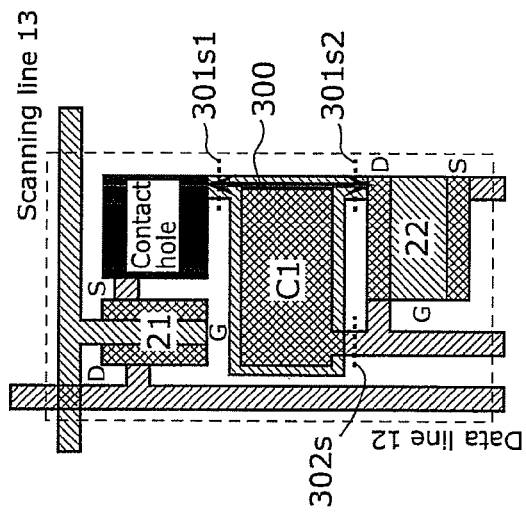

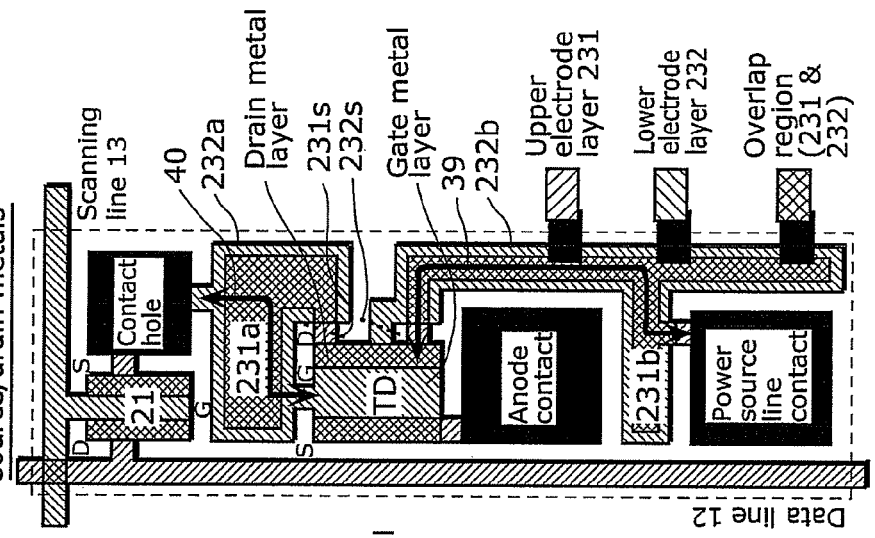
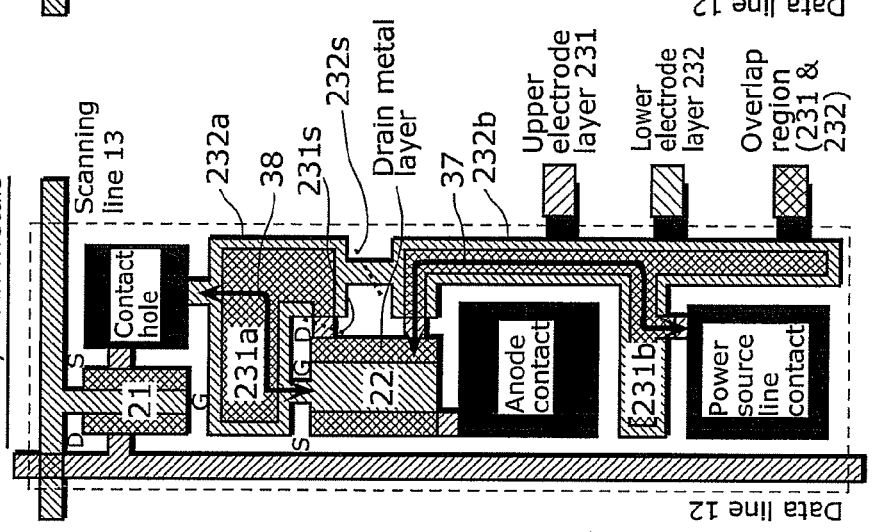
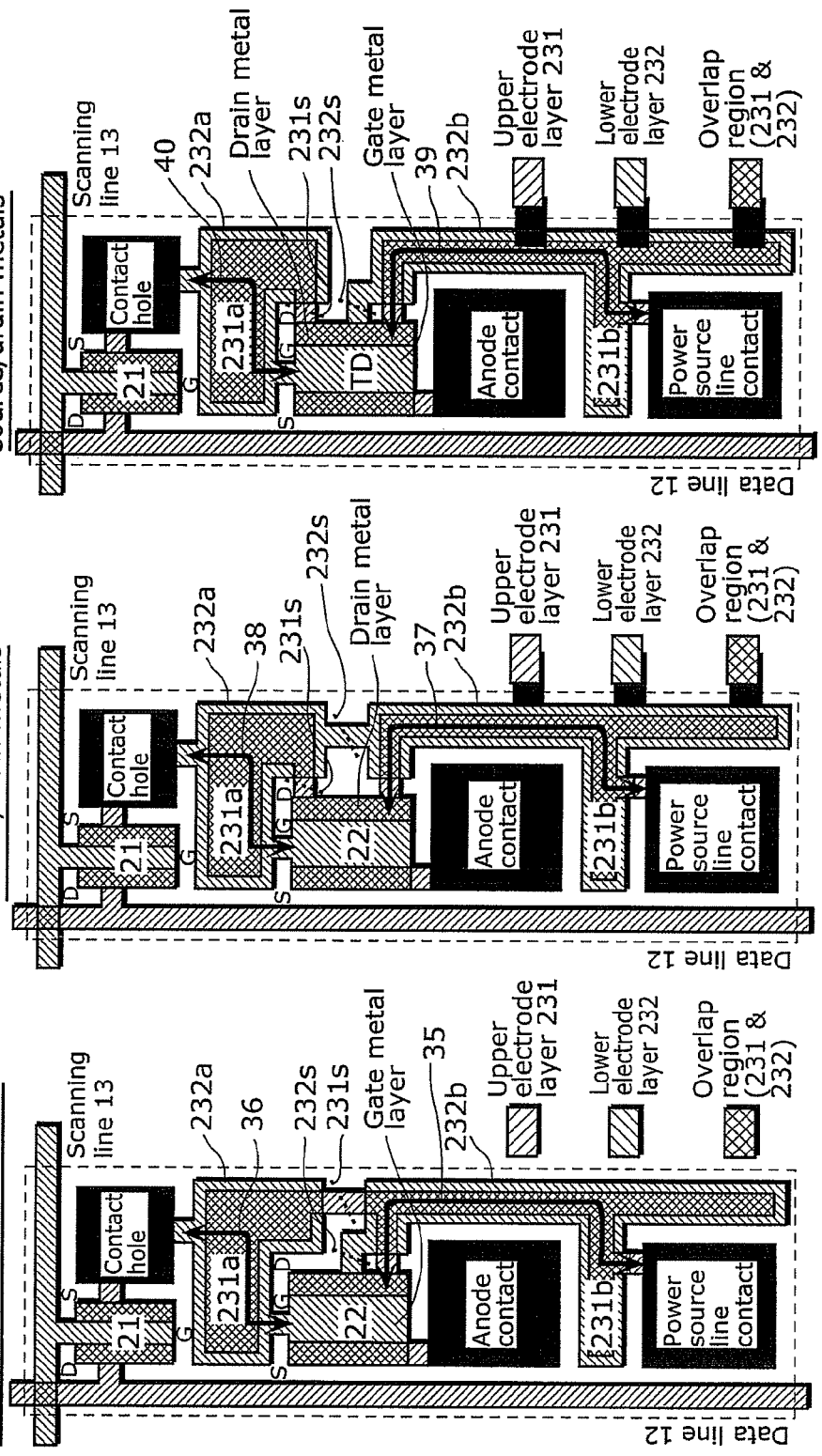

DISPLAY DEVICE AND METHOD OF MANUFACTURING THE SAME

CROSS REFERENCE TO RELATED APPLICATION

This is a continuation application of PCT application No. PCT/JP2010/003235 filed on May 13, 2010, designating the United States of America.

BACKGROUND OF THE INVENTION (1) Field of the Invention

The present invention relates to a display device and a method of manufacturing the same, and in particular, to a display device having a repairable pixel structure and a method of manufacturing the display device.

(2) Description of the Related Art

Organic electroluminescence (EL) displays including organic electroluminescence elements (hereinafter referred to as organic EL elements) are known as image display devices including current-driven luminescent elements. The organic EL displays are attracting attention as a candidate for next-generation flat panel displays (FPDs) because they are viewable at wide angles and consume a small amount of power.

Usually, organic EL elements included in pixels are arranged in a matrix pattern. For example, in active-matrix organic EL displays, thin-film transistors (TFTs) are provided at intersections of scanning lines and data lines, and each TFT is connected with a capacitor (capacitor) and the gate of a driving transistor. The TFT is turned on through a selected scanning line to allow a data signal to be provided to the driving transistor and the capacitor through a corresponding data line so that the driving transistor and the capacitor control the timing when the organic EL element produces a luminescence. With this configuration of the pixel controller, the active-matrix organic EL displays can cause the organic EL elements to keep producing luminescence until next scanning (selection), and thus there is no reduction in the display luminance even when the duty ratio increases. However, as typified by the active-matrix organic EL displays, when the complexity of the controller configuration of the luminescent pixels increases or when the number of luminescent pixels increases, electrical troubles, such as a short circuit and/or an open circuit of circuit elements and transmission lines, are more likely to occur during a manufacturing process which requires fine processing.

With organic EL panels, in particular, the capacitors included in the pixel controllers have a relatively wide element area. Consequently, the capacitors are susceptible to a particle or the like present between electrodes, thereby causing a higher percent defective of pixels through a short circuit.

Meanwhile, there is a method proposed for repairing a defective luminescent pixel after forming pixel controller elements and transmission lines. In order to repair a defective luminescent pixel which has become a bright point in a constant luminescent status due to a short circuit of a circuit element or the like, Japanese Unexamined Patent Application Publication No. 2008-203636 (hereinafter referred to as Patent Reference 1) provides, in each of the luminescent pixel regions, a non-overlap portion connected to other conductive portions and transmission lines with some distance therefrom. To repair a defective luminescent pixel, the non-overlap portion is disconnected by laser irradiation. With this, transmission of electric signals to the defective luminescent pixel is blocked. Moreover, the defective luminescent pixel becomes a dark point without any damage from the laser irradiation.

Furthermore, in Japanese Unexamined Patent Application Publication No. 2007-66904 (hereinafter referred to as Patent Reference 2), a pixel electrode formed in a luminescent region of each luminescent pixel is provided by connecting cells, so that by disconnecting a cell connection with a laser, only the defective luminescent cell is electrically insulated and becomes a dark point.

In order to increase density of pixels according to the increase in the number of luminescent pixels for enhanced-definition of display panels, it is necessary to devise, particularly, a layout of capacitors having a higher area ratio. The effective solution is that capacitors function as both the originally-given capacitance elements and transmission lines for connecting circuit elements to each other (hereinafter also referred to as a transmission-line function).

However, when a current-leaking portion is to be repaired with a laser or the like with the structure described in Patent Reference 2 while the capacitors function both as the capacitance elements and the transmission lines, in order to deal with a shorted circuit of the capacitor, which is the main cause of defective pixels, the transmission lines are frequently disconnected depending on a short-circuited portion. If so, the transmission-line function is lost. As a result, although the defective luminescent pixel can become a dark point, it cannot restore the function as a normal luminescent pixel.

Furthermore, although the structure and method described in Patent Reference 1 can make the capacitor electrically insulated from the other circuit elements so that the capacitor is disabled, there is a limitation on arranging all the capacitors as non-overlap portions connected to other conductive portions and transmission lines with some distance therefrom to devise the layout of the capacitors for increasing the density of pixels according to the increase in the number of luminescent pixels.

Even when the defective luminescent pixel can become a dark point or the organic EL element produces a luminescence at different timing of the other normal luminescent pixels according to any of the prior arts, it is not possible that the defective luminescent pixel produces the luminescence at the same timing as the normal luminescent pixel to improve the display quality of the luminescent panel.

The present invention, conceived in view of the above problems, has an object of providing (i) a display device that enables a defective luminescent pixel including a short-circuited capacitor to produce a luminescence with proper luminescent timing and (ii) a method of manufacturing the display device, even when the density of pixels increases.

SUMMARY OF THE INVENTION

In order to solve the problems, the display device according to an aspect of the present invention is a display device including display pixels that are two-dimensionally arranged, each of the display pixels including stacked layers including a display element layer and a control layer that drives the display element layer, the control layer including a capacitor including an upper electrode layer and a lower electrode layer that face each other in a layer-stacking direction, the capacitor being a parallel-plate capacitor, the upper electrode layer including a first upper capacitor electrode, a second upper capacitor electrode, and a first disconnectable portion, the first upper capacitor electrode functioning as a transmission line for connecting a first circuit element to a second circuit element, and the second upper capacitor electrode being connected to the first upper capacitor electrode through the first disconnectable portion and not functioning as a transmission line, and the lower electrode layer including a first lower capacitor electrode, a second lower capacitor electrode, and a second disconnectable portion, the first lower capacitor electrode functioning as a transmission line for connecting a third circuit element to a fourth circuit element, and the second lower capacitor electrode being connected to the first lower capacitor electrode through the second disconnectable portion and not functioning as a transmission line, wherein the capacitor holds a predetermined capacitance each between the first upper capacitor electrode and the second lower capacitor electrode, and between the first lower capacitor electrode and the second upper capacitor electrode.

The display device and the method of manufacturing the same according to the present invention can maintain the conductivity of a capacitor as a transmission line even after repairing a short-circuited portion, and ensure the capacitance function, by including a disconnectable portion at a predetermined position in each of two facing electrode layers functioning as a transmission line and a capacitance element. Thus, a defective luminescent pixel including a short-circuited capacitor can produce a luminescence with proper luminescent timing, and the display quality of the luminescent panel can be improved, even when the density of pixels increases.

FURTHER INFORMATION ABOUT TECHNICAL BACKGROUND TO THIS APPLICATION

The disclosure of PCT application No. PCT/JP2010/003235 filed on May 13, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 9A is a first layout drawing illustrating a luminescent pixel included in a conventional display device;

FIG. 9B is a second layout drawing illustrating a luminescent pixel included in a conventional display device;

FIG. 9C is a first layout drawing illustrating a luminescent pixel included in a display device according to the present invention;

FIG. 11A is a third layout drawing illustrating a luminescent pixel included in a display device according to the present invention;

FIG. 11B is a fourth layout drawing illustrating a luminescent pixel included in a display device according to the present invention;

FIG. 11C is a fifth layout drawing illustrating a luminescent pixel included in a display device according to the present invention.

DESCRIPTION OF THE PREFERRED EMBODIMENTS

Figure 1:
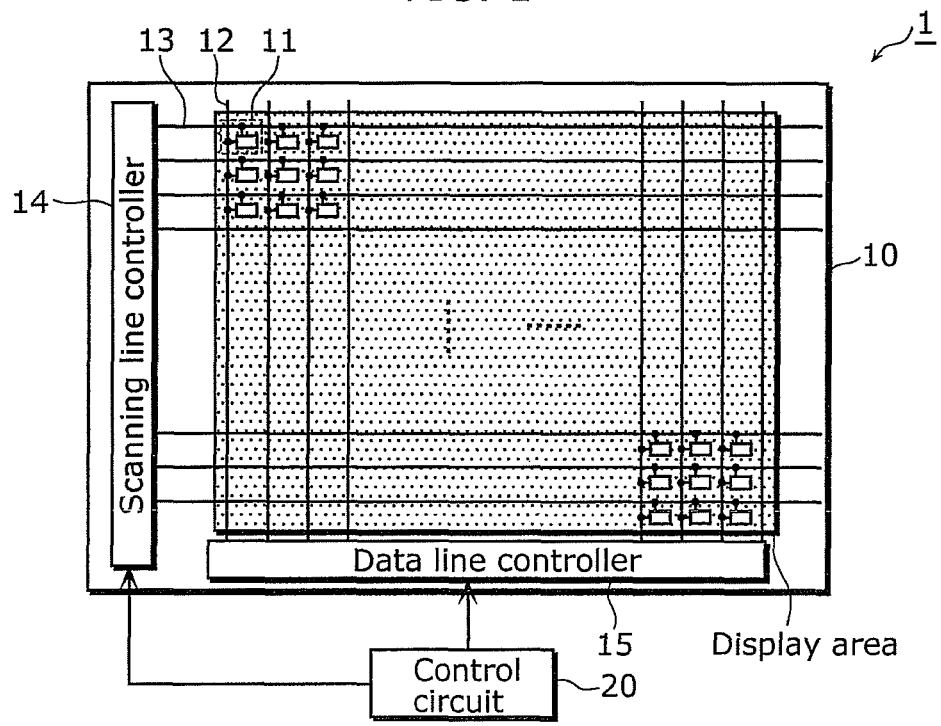
FIG. 1 is a block diagram illustrating a structure of a display device according to Embodiment 1 of the present invention.

The display device according to an aspect of the present invention is a display device including display pixels that are two-dimensionally arranged, each of the display pixels including stacked layers including a display element layer and a control layer that drives the display element layer, the control layer including a capacitor including an upper electrode layer and a lower electrode layer that face each other in a layer-stacking direction, the capacitor being a parallel-plate capacitor, the upper electrode layer including a first upper capacitor electrode, a second upper capacitor electrode, and a first disconnectable portion, the first upper capacitor electrode functioning as a transmission line for connecting a first circuit element to a second circuit element, and the second upper capacitor electrode being connected to the first upper capacitor electrode through the first disconnectable portion and not functioning as a transmission line, and the lower electrode layer including a first lower capacitor electrode, a second lower capacitor electrode, and a second disconnectable portion, the first lower capacitor electrode functioning as a transmission line for connecting a third circuit element to a fourth circuit element, and the second lower capacitor electrode being connected to the first lower capacitor electrode through the second disconnectable portion and not functioning as a transmission line, wherein the capacitor holds a predetermined capacitance each between the first upper capacitor electrode and the second lower capacitor electrode, and between the first lower capacitor electrode and the second upper capacitor electrode.

In order to increase the density of pixels, one of two facing electrodes of a capacitor included in a pixel is conventionally also used as a portion of a transmission line and a capacitance element. However, since it is necessary to maintain the conductive characteristics as a transmission line while ensuring a function as a pixel itself, the defective electrode cannot be disconnected even when the electrode used also as a transmission line is short-circuited in repairing the capacitor under the conventional structure. In other words, there was a limitation in a portion to be disconnected in the defective portion of a capacitor.

According to the present invention, even when a portion of a capacitor is also used as a transmission line, there is no limitation in the disconnectable portion of the defective portion of a capacitor in repairing. Thus, the characteristics as the transmission line can be always maintained even after the repairing.

For example, when there is a pixel in which a short-circuit failure occurs between the first upper capacitor electrode and the second lower capacitor electrode, the second disconnectable portion is disconnected. Thereby, maintained are the capacitance function between the first lower capacitor electrode and the second upper capacitor electrode, and the transmission-line function of connecting the first circuit element to the second circuit element, and the third circuit element to the fourth circuit element. Furthermore, when there is a pixel in which a short-circuit failure occurs between the first lower capacitor electrode and the second upper capacitor electrode, the first disconnectable portion is disconnected. Thereby, maintained are the capacitance function between the first upper capacitor electrode and the second lower capacitor electrode, and the transmission-line function of connecting the first circuit element to the second circuit element, and the third circuit element to the fourth circuit element. Thereby, each portion of the lower and upper electrodes of the capacitor can be effectively used as a transmission line, and the density of pixels can be further increased.

Moreover, in the display device according to an aspect of the present invention, at least one of the following may be true: i) the upper electrode layer further includes a third upper capacitor electrode and a third disconnectable portion, the third upper capacitor electrode being connected to the first upper capacitor electrode through the third disconnectable portion; and ii) the lower electrode layer further includes a third lower capacitor electrode and a fourth disconnectable portion, the third lower capacitor electrode being connected to the first lower capacitor electrode through the fourth disconnectable portion, and the capacitor may hold a predetermined capacitance between at least one of: the third upper capacitor electrode and the first lower capacitor electrode; and the third lower capacitor electrode and the first upper capacitor electrode.

When a short-circuit failure occurs in a capacitor, compared with a capacitor having one of two facing electrodes divided into two electrodes, the capacitor according to an aspect of the present invention can maintain the characteristics as the transmission line even after being repaired by disconnecting only one of the divided three electrodes. Thus, a difference between the capacitance of the repair-free capacitor and the capacitance of the repaired capacitor is smaller than a difference between (i) the capacitance of a repair-free capacitor including neither third upper capacitor electrode nor third lower capacitor electrode and (ii) the capacitance of the repaired capacitor thereof.

For example, when there is a pixel in which a short-circuit failure occurs between the first upper capacitor electrode and the third lower capacitor electrode, the fourth disconnectable portion is disconnected. Thereby, maintained are the capacitance function between the first lower capacitor electrode and the second upper capacitor electrode, between the first lower capacitor electrode and the third upper capacitor electrode, and between the first upper capacitor electrode and the second lower capacitor electrode, and the transmission-line function of connecting the first circuit element to the second circuit element, and the third circuit element to the fourth circuit element. Furthermore, when there is a pixel in which a short-circuit failure occurs between the first lower capacitor electrode and the third upper capacitor electrode, the third disconnectable portion is disconnected. Thereby, maintained are the capacitance function between the first upper capacitor electrode and the second lower capacitor electrode, between the first upper capacitor electrode and the third lower capacitor electrode, and between the first lower capacitor electrode and the second upper capacitor electrode, and the transmission-line function of connecting the first circuit element to the second circuit element, and the third circuit element to the fourth circuit element. Thereby, each portion of the lower and upper electrodes of the capacitor can be effectively used as a transmission line, and the density of pixels can be further increased.

Moreover, in the display device according to an aspect of the present invention, at least one of the following may be true: i) the upper electrode layer further includes a fourth upper capacitor electrode, a fifth disconnectable portion, and a sixth disconnectable portion, the fourth upper capacitor electrode being connected to the second upper capacitor electrode through the fifth disconnectable portion and connected to the third upper capacitor electrode through the sixth disconnectable portion; and ii) the lower electrode layer further includes a fourth lower capacitor electrode, a seventh disconnectable portion, and an eighth disconnectable portion, the fourth lower capacitor electrode being connected to the second lower capacitor electrode through the seventh disconnectable portion and connected to the third lower capacitor electrode through the eighth disconnectable portion, and the capacitor may hold a predetermined capacitance between at least one of: the fourth upper capacitor electrode and the first lower capacitor electrode; and the fourth lower capacitor electrode and the first upper capacitor electrode.

When a short-circuit failure occurs in a capacitor, compared with a capacitor having one of two facing electrodes divided into three electrodes, the capacitor according to an aspect of the present invention can maintain the characteristics as the transmission line even after being repaired by disconnecting only one of the divided four electrodes. Thus, a difference between the capacitance of the repair-free capacitor and the capacitance of the repaired capacitor is smaller than a difference between (i) the capacitance of a repair-free capacitor including neither fourth upper capacitor electrode nor fourth lower capacitor electrode and (ii) the capacitance of the repaired capacitor thereof.

For example, when there is a pixel in which a short-circuit failure occurs between the first upper capacitor electrode and the fourth lower capacitor electrode, the seventh and the eighth disconnectable portions are disconnected. Thereby, maintained are the capacitance function between the first lower capacitor electrode and the second upper capacitor electrode, between the first lower capacitor electrode and the third upper capacitor electrode, between the first lower capacitor electrode and the fourth upper capacitor electrode, and between the first upper capacitor electrode and the second lower capacitor electrode, and the transmission-line function of connecting the first circuit element to the second circuit element, and the third circuit element to the fourth circuit element. Furthermore, when there is a pixel in which a short-circuit failure occurs between the first lower capacitor electrode and the fourth upper capacitor electrode, the fifth and the sixth disconnectable portions are disconnected. Thereby, maintained are the capacitance function between the first upper capacitor electrode and the second lower capacitor electrode, between the first upper capacitor electrode and the third lower capacitor electrode, between the first upper capacitor electrode and the fourth lower capacitor electrode, between the first lower capacitor electrode and the second upper capacitor electrode, and between the first lower capacitor electrode and the third upper capacitor electrode, and the transmission-line function of connecting the first circuit element to the second circuit element, and the third circuit element to the fourth circuit element. Thereby, each portion of the lower and upper electrodes of the capacitor can be effectively used as a transmission line, and the density of pixels can be further increased.

Moreover, in the display device according to an aspect of the present invention, at least one of the following may be true: i) the upper electrode layer further includes a third upper capacitor electrode and a third disconnectable portion, the third upper capacitor electrode being connected to the second upper capacitor electrode through the third disconnectable portion; and ii) the lower electrode layer further includes a third lower capacitor electrode and a fourth disconnectable portion, the third lower capacitor electrode being connected to the second lower capacitor electrode through the fourth disconnectable portion, and the capacitor may hold a predetermined capacitance between at least one of: the third upper capacitor electrode and the first lower capacitor electrode; and the third lower capacitor electrode and the first upper capacitor electrode.

When a short-circuit failure occurs in a capacitor, compared with a capacitor having one of two facing electrodes divided into two electrodes, the capacitor according to an aspect of the present invention can maintain the characteristics as the transmission line even after being repaired by disconnecting only one of the divided three electrodes. Thus, a difference between the capacitance of the repair-free capacitor and the capacitance of the repaired capacitor is smaller than a difference between (i) the capacitance of a repair-free capacitor including neither third upper capacitor electrode nor third lower capacitor electrode and (ii) the capacitance of the repaired capacitor thereof.

For example, when there is a pixel in which a short-circuit failure occurs between the first upper capacitor electrode and the third lower capacitor electrode, the fourth disconnectable portion is disconnected. Thereby, maintained are the capacitance function between the first lower capacitor electrode and the second upper capacitor electrode, between the first lower capacitor electrode and the third upper capacitor electrode, and between the first upper capacitor electrode and the second lower capacitor electrode, and the transmission-line function of connecting the first circuit element to the second circuit element, and the third circuit element to the fourth circuit element. Furthermore, when there is a pixel in which a short-circuit failure occurs between the first lower capacitor electrode and the third upper capacitor electrode, the third disconnectable portion is disconnected. Thereby, maintained are the capacitance function between the first upper capacitor electrode and the second lower capacitor electrode, between the first upper capacitor electrode and the third lower capacitor electrode, and between the first lower capacitor electrode and the second upper capacitor electrode, and the transmission-line function of connecting the first circuit element to the second circuit element, and the third circuit element to the fourth circuit element. Thereby, each portion of the lower and upper electrodes of the capacitor can be effectively used as a transmission line, and the density of pixels can be further increased.

Moreover, in the display device according to an aspect of the present invention, each of the first disconnectable portion and the second disconnectable portion preferably has a shape that allows disconnection by laser irradiation.

Thereby, a set of facing capacitor electrodes between which a short circuit occurs can be disconnected from the capacitor by disconnecting a corresponding disconnectable portion at an appropriate portion by laser irradiation. Thus, the capacitor can hold a voltage corresponding to a signal voltage provided through a corresponding data line and causes the luminescent elements to produce luminescences with proper luminescent timing.

Moreover, in the display device according to an aspect of the present invention, it is preferable that the first disconnectable portion included in the upper electrode layer is formed in an area excluding an area where the first lower capacitor electrode, the second lower capacitor electrode, and the second disconnectable portion that are included in the lower electrode layer are projected in the layer-stacking direction, and that the second disconnectable portion included in the lower electrode layer is formed in an area excluding an area where the first upper capacitor electrode, the second upper capacitor electrode, and the first disconnectable portion that are included in the upper electrode layer are projected in the layer-stacking direction.

According to an aspect of the present invention, another disconnectable portion and an electrode are not formed in an area obtained by projecting, in the layer-stacking direction, an area including a disconnectable portion irradiated with a laser, that is, an area facing the disconnectable portion that is within a plane of another layer included in two electrode layers and that is irradiated with the laser. Thereby, it is possible to prevent damage on an area included in a capacitor when the disconnectable portion is irradiated with a laser. Thus, although the capacitance of the capacitor is reduced by the area proportion of the disconnected electrodes, the capacitor can hold a voltage corresponding to a signal voltage provided through a corresponding data line and causes the luminescent elements to produce luminescences with proper luminescent timing. Thus, the display quality of the display device can be improved.

Moreover, in the display device according to an aspect of the present invention, the display pixels may include the first circuit element, the second circuit element, the third circuit element, and the fourth circuit element, and each of the first circuit element, the second circuit element, the third circuit element, and the fourth circuit element may be one of a driver, a switch, a capacitor, a luminescent element, a scanning line, a control line, and a power source line.

The capacitor according to an aspect of the present invention functions as a transmission line included in a conducting path of the circuit elements.

Moreover, in the display device according to an aspect of the present invention, the capacitor may be a capacitor having, as a holding voltage, a voltage corresponding to a signal voltage provided for each of the display pixels, the control layer may have a gate connected to one of terminals of the capacitor, and may include a driving transistor that converts the holding voltage into a signal current that is a source-to-drain current with application of the holding voltage to the gate, and the display element layer may include a luminescent element that produces a luminescence according to a flow of the signal current.

The capacitor according to an aspect of the present invention is applicable to an active-matrix display device capable of separately controlling timing to apply a signal voltage and luminescent timing.

Moreover, in the display device according to an aspect of the present invention, the luminescent element may be an organic electroluminescence (EL) element.

The luminescent elements according to an aspect of the present invention are applicable to an organic EL display device including a current-driven organic EL element.

Furthermore, the present invention can be not only implemented as a display device including such characteristic units, but also as a method of manufacturing a display device including, as steps, the characteristic units included in the display device.

Embodiments of the present invention will be described hereinafter with reference to drawings. Embodiments and the drawings will be described and illustrated by the same constituent elements with the same reference numerals hereinafter. Furthermore, described hereinafter as an example is a display device which includes an upper-surface-luminescent organic EL element having the anode as the lower surface and the cathode as the upper surface.

Embodiment 1

A display device according to Embodiment 1 includes display pixels that are two-dimensionally arranged. Each of the display pixels includes stacked layers including a display element layer and a control layer that drives the display element layer, and the control layer includes a capacitor including an upper electrode layer and a lower electrode layer that face each other in a layer-stacking direction, the capacitor being a parallel-plate capacitor. The upper electrode layer includes a first upper capacitor electrode, a second upper capacitor electrode, and a first disconnectable portion, the first upper capacitor electrode functions as a transmission line for connecting a first circuit element to a second circuit element, and the second upper capacitor electrode is connected to the first upper capacitor electrode through the first disconnectable portion and does not function as a transmission line. The lower electrode layer includes a first lower capacitor electrode, a second lower capacitor electrode, and a second disconnectable portion, the first lower capacitor electrode functions as a transmission line for connecting a third circuit element to a fourth circuit element, and the second lower capacitor electrode is connected to the first lower capacitor electrode through the second disconnectable portion and does not function as a transmission line. The capacitor holds a predetermined capacitance each between the first upper capacitor electrode and the second lower capacitor electrode, and between the first lower capacitor electrode and the second upper capacitor electrode. Thereby, even when a short-circuit failure occurring in any portion of the capacitor can be repaired, each portion of the lower and upper electrodes of the capacitor can be effectively used as a transmission line, and the density of the pixels can be further increased.

Embodiment 1 of the present invention will be described hereinafter with reference to drawings.

FIG. 1 is a block diagram illustrating a configuration of a display device 1 according to Embodiment 1 of the present invention. The display device 1 includes a display panel 10 and a control circuit 20. The display panel 10 includes luminescent pixels 11, data lines 12 each provided for a corresponding column of the luminescent pixels, scanning lines 13 each provided for a corresponding row of the luminescent pixels, a scanning line controller 14, and a data line controller 15.

The luminescent pixels 11 are display pixels arranged in a matrix on the display panel 10.

The scanning line controller 14 drives circuit elements included in the luminescent pixels by providing scanning signals to the scanning lines 13.

The data line controller 15 causes luminescent pixels to produce luminescences according to luminescent signals, by providing a signal voltage and a reference voltage to the data lines 12.

The control circuit 20 controls timing when the scanning line controller 14 provides the scanning signals. Furthermore, the control circuit 20 controls timing when the data line controller 15 provides the signal voltage.

Figure 2:
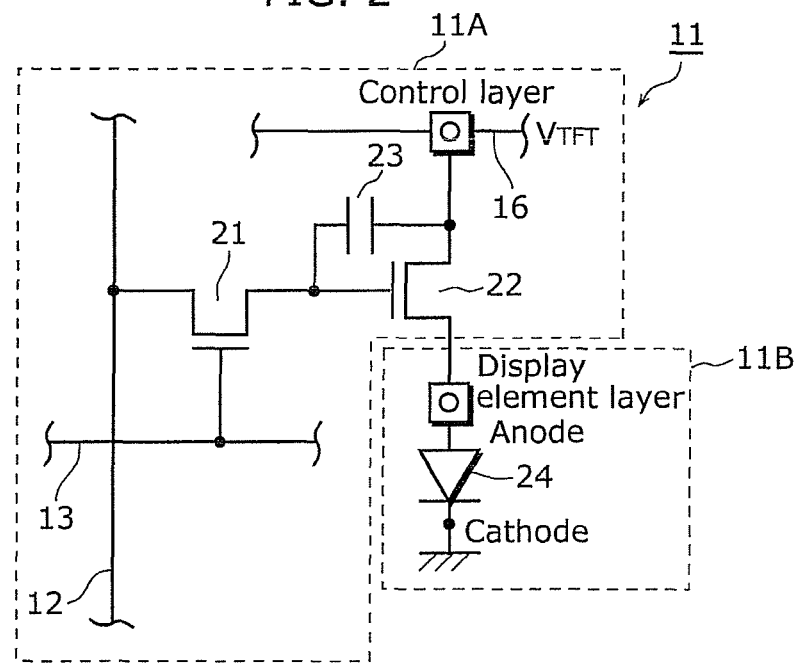
FIG. 2 is an example of a main circuit configuration diagram of a luminescent pixel according to Embodiment 1 of the present invention.

FIG. 2 is an example of a main circuit configuration diagram of a luminescent pixel according to Embodiment 1 of the present invention. The luminescent pixel 11 in FIG. 2 includes a control layer 11A and a display element layer 11B. The control layer 11A includes, for example, a switching transistor 21, a driving transistor 22, and a capacitor 23. The switching transistor 21 has the drain electrode connected to a corresponding data line 12, the gate electrode connected to a corresponding scanning line 13, and the source electrode connected to the capacitor 23 and to the gate electrode of the driving transistor 22. Furthermore, the driving transistor 22 has the drain electrode connected to a power source line 16, and the source electrode connected to the anode of the display element layer 11B.

With this configuration, when a scanning signal is provided to the scanning line 13 and the switching transistor 21 is thus turned on, a signal voltage supplied through the data line 12 is held in the capacitor 23. Then, the signal voltage in the capacitor 23 is held throughout one frame period, and with this held voltage, the conductance of the driving transistor 22 changes in an analog manner, and a driving current corresponding to a luminescent level is supplied to the anode of the display element layer 11B. Furthermore, the driving current supplied to the anode of the display element layer 11B flows into an organic EL element 24 and the cathode of the display element layer 11B. With this, the organic EL element 24 of the display element layer 11B produces a luminescence and an image is displayed.

Note that the control layer 11A is not limited to the above circuit configuration. That is to say, although the switching transistor 21, the driving transistor 22, and the capacitor 23 are the essential constituent elements of the circuit for passing, to the display element layer 11B, a driving current corresponding to a signal voltage, they are not limited to the above configuration. Moreover, the control layer 11A according to an implementation of the present invention may also include another circuit constituent element in addition to the above circuit constituent elements.

The control layer 11A and the display element layer 11B are stacked on, for example, a glass substrate, and display pixels are two-dimensionally arranged in the display element layer 11B. When the display device 1 has a top-emission structure, that is, a voltage is applied to the display element layer 11B, the organic EL element 24 produces a luminescence and the luminescence travels upward through a transparent cathode and a transparent sealing film. The luminescence produced by the organic EL element 24 and traveled downward is reflected by the anode and travels upward through the transparent cathode and the transparent sealing film.

Next, the structure and functions of the capacitor 23 that is a main constituent element of the present invention will be described. The control layer 11A includes the capacitor 23 that is a parallel-plate capacitor and includes upper and lower electrode layers that face each other in a layer-stacking direction.

Figure 3A:
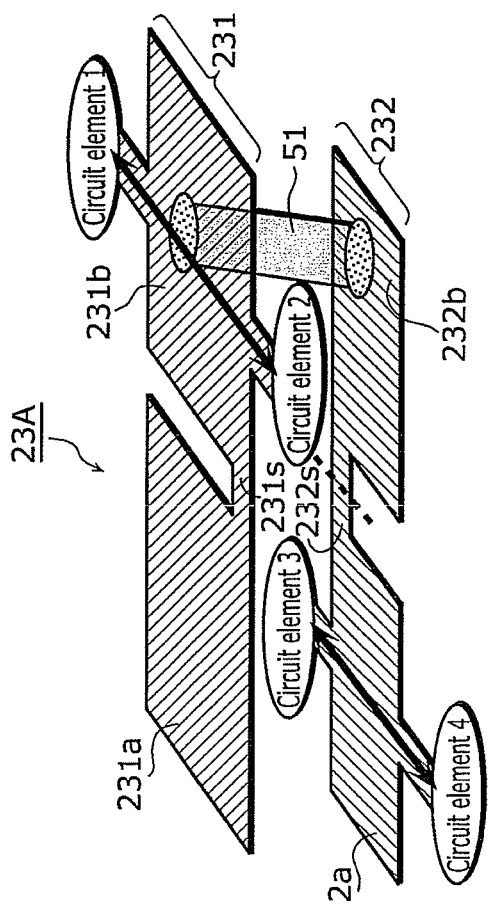
FIG. 3A illustrates a top perspective view of an electrode structural diagram of a capacitor included in a display device according to Embodiment 1 of the present invention.
Figure 3B:
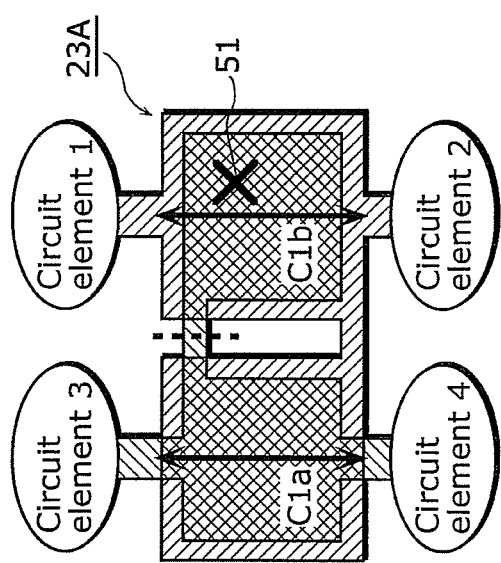
FIG. 3B illustrates a perspective view of an electrode structural diagram of a capacitor included in a display device according to Embodiment 1 of the present invention.

FIG. 3A illustrates a top perspective view of an electrode structural diagram of a capacitor 23A included in a display device according to Embodiment 1 of the present invention. Furthermore, FIG. 3B illustrates a perspective view of the electrode structural diagram of the capacitor 23A. The capacitor 23A in FIGS. 3A and 3B is an example of the capacitor 23 in FIG. 2, and includes an upper electrode layer 231, a lower electrode layer 232, and an insulating layer (not illustrated) formed between the upper electrode layer 231 and the lower electrode layer 232.

The upper electrode layer 231 includes upper capacitor electrodes 231a and 231b, and a disconnectable portion 231s that are coplanar. The upper capacitor electrode 231a that is a first upper capacitor electrode is connected to the upper capacitor electrode 231b that is a second upper capacitor electrode, through the disconnectable portion 231s that is a first disconnectable portion. Furthermore, the lower electrode layer 232 includes lower capacitor electrodes 232a and 232b, and a disconnectable portion 232s that are coplanar. The lower capacitor electrode 232a that is a first lower capacitor electrode is connected to the lower capacitor electrode 232b that is a second lower capacitor electrode, through the disconnectable portion 232s that is a second disconnectable portion.

The upper capacitor electrode 231b functions not only as one of two facing electrodes of the capacitor 23A but also as a transmission line that connects a circuit element 1 that is a first circuit element to a circuit element 2 that is a second circuit element. Furthermore, the lower capacitor electrode 232a functions not only as one of the two facing electrodes of the capacitor 23A but also as a transmission line that connects a circuit element 3 that is a third circuit element to a circuit element 4 that is a third circuit element. FIGS. 3B and 2 have the following correspondences: the circuit element 3 corresponds to the source electrode of the switching transistor 21; the circuit element 4 corresponds to the gate electrode of the driving transistor 22; the circuit element 1 corresponds to the power source line 16; and the circuit element 2 corresponds to the drain electrode of the driving transistor 22.

Each of the upper electrode layer 231 and the lower electrode layer 232 includes an alloy of molybdenum (Mo) and tungsten (W), or has a stacked structure including: an alloy of Mo and W; aluminum (Al); and an alloy of Mo and W, and has a thickness of 150 nm, for example.

Here, the disconnectable portion has a function of making, non-conductive, the two capacitor electrodes electrically connected through the disconnectable portion by disconnecting the disconnectable portion. Thus, each of the disconnectable portions 231s and 232s has, for example, a line width of 4 μm and a length of 4 μm in a plain view, and has a shape that allows disconnection by laser irradiation. The shape that allows disconnection by irradiating a portion of each of the disconnectable portions 231s and 232s with a laser is closely related to the specifications of the laser used. For example, in the case where a laser oscillator having a yttrium aluminum garnet (YAG) laser as the light source is used with a laser having an output parameter of 532 nm in wavelength, 10 ns in pulse width, and 0.5 mW in power, for example, the disconnectable portions 231s and 232s can be disconnected without damaging the other normal electrodes, provided that the disconnectable portions 231s and 232s have the aforementioned shape. Thereby, a set of the facing capacitor electrodes between which a short circuit occurs can be disconnected from the capacitor by disconnecting a corresponding disconnectable portion by laser irradiation.

Furthermore, the disconnectable portion 231s included in the upper electrode layer 231 is formed in an area excluding an area where the lower capacitor electrodes 232a and 232b and the disconnectable portion 232s included in the lower electrode layer 232 are projected in the layer-stacking direction. Similarly, the disconnectable portion 232s included in the lower electrode layer 232 is formed in an area excluding an area where the upper capacitor electrodes 231a and 231b and the disconnectable portion 231s included in the upper electrode layer 232 are projected in the layer-stacking direction. Thereby, when one of the disconnectable portions 231s and 232s is irradiated with a laser, it is possible to prevent damage on the upper capacitor electrodes 231a and 231b, the lower capacitor electrodes 232a and 232b, and the other one of the disconnectable portions 231s and 232s that is not disconnected, among the constituent elements of the capacitor 23A. Thus, although the capacitance of the capacitor 23A is reduced by the area proportion of the disconnected electrodes, the capacitor 23A can hold a voltage corresponding to a signal voltage provided through a corresponding data line and causes the luminescent elements to produce luminescences with proper luminescent timing.

The insulating layer formed between the upper electrode layer 231 and the lower electrode layer 232 is, for example, a silicon oxide (SiOx) film or a silicon nitride (SiN) film. The insulating layer has a thickness of 150 nm, for example. Note that the insulating layer may be made of a dielectric material so that the capacitor ensures a desired capacitance.

With the structure, as illustrated in FIG. 3A, the capacitor 23A including normal pixels can hold a predetermined capacitance C1b between the upper capacitor electrode 231b and the lower capacitor electrode 232b, and a predetermined capacitance C1a between the lower capacitor electrode 232a and the upper capacitor electrode 231a.

FIGS. 3A and 3B also illustrate that a short circuit 51 occurs between the upper capacitor electrode 231b and the lower capacitor electrode 232b by uneven distribution of conductive particles or others in the insulating layer between the upper capacitor electrode 231b and the lower capacitor electrode 232b. Thereby, the charge that should be accumulated in the capacitor 23A with application of the voltage between the upper electrode layer 231 and the lower electrode layer 232 is not held due to the short circuit 51. In this case, disconnecting the disconnectable portion 232s by laser irradiation for such a defective luminescent pixel can maintain the capacitance between the upper capacitor electrode 231a and the lower capacitor electrode 232a, and the transmission-line function of connecting the circuit elements 1 to 2 and the circuit elements 3 to 4. Thereby, each portion of the lower and upper electrodes of the capacitor 23A can be effectively used as a transmission line, and the density of pixels can be further increased.

Figure 4A:
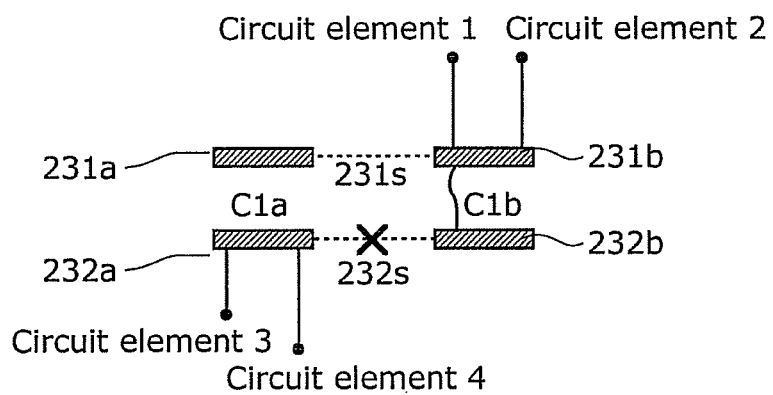
FIG. 4A illustrates an equivalent circuit diagram of a capacitor according to Embodiment 1 of the present invention.
Figure 4B:
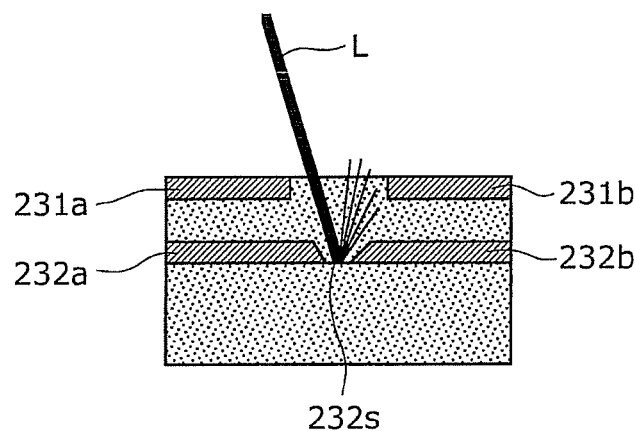
FIG. 4B illustrates how the capacitor is irradiated with a laser to disconnect capacitor electrodes according to Embodiment 1 of the present invention.

FIG. 4A illustrates an equivalent circuit diagram of the capacitor 23A according to Embodiment 1 of the present invention. When both the upper electrode layer 231 and the lower electrode layer 232 of the capacitor 23A are not short-circuited, the capacitance of the capacitor 23A is a sum of the capacitances of the capacitor electrodes (C1a+C1b). Here, when the upper capacitor electrode 231b and the lower capacitor electrode 232b are short-circuited as illustrated in FIG. 4A according to Embodiment 1, the capacitance of the capacitor electrodes including the short-circuited portion is disabled. More specifically, the disconnectable portion 232s is irradiated with a laser from a direction approximately perpendicular to the film surface. FIG. 4B illustrates how the capacitor is irradiated with a laser to disconnect a disconnectable portion according to Embodiment 1 of the present invention. FIG. 4B, L denotes a path of a laser beam, and the disconnectable portion 232s is disconnected by the laser beam. Thereby, although the capacitor 23A does not have the capacitance between the upper capacitor electrode 231b and the lower capacitor electrode 232b, it maintains the transmission-line function of connecting the circuit element 1 to the circuit element 2 and the circuit element 3 to the circuit element 4, and has the capacitance between the upper capacitor electrode 231a and the lower capacitor electrode 232a.

Furthermore, the disconnectable portion 232s included in the lower electrode layer 232 is formed in an area excluding an area where the upper capacitor electrodes 231a and 231b and the disconnectable portion 231s included in the upper electrode layer 231 are projected in the layer-stacking direction. Thereby, it is possible to prevent damage on the upper capacitor electrode 231a, the lower capacitor electrode 232b, and the disconnectable portion 231s included in the capacitor 23A when the disconnectable portion 232s is irradiated with a laser.

Thus, although the capacitance of the repaired capacitor 23A is reduced by the area proportion of the disconnected electrodes from the original capacitance (C1a+C1b), resulting in the capacitance C1a, the capacitor 23A can hold a voltage corresponding to a signal voltage provided through a corresponding data line and causes the display element layer 11B to produce a luminescence with proper luminescent timing.

Instead of the short circuit 51 in FIGS. 3A and 3B, when a short-circuit failure occurs between the upper capacitor electrode 231a and the lower capacitor electrode 232a, disconnecting the disconnectable portion 231s by laser irradiation for such a defective luminescent pixel can maintain the capacitance between the upper capacitor electrode 231b and the lower capacitor electrode 232b, and the transmission-line function of connecting the circuit elements 1 to 2 and the circuit elements 3 to 4.

Furthermore, the laser may be irradiated from the lower surface of the luminescent panel 10 via the substrate, instead of the upper surface. Compared with the laser irradiation from the upper surface, the laser irradiation from the lower surface shown in FIG. 4B is beneficial in repairing the capacitor 23A after forming the display element layer 11B on the control layer 11A. This is because the laser irradiation from the lower surface does not allow the laser to pass through the display element layer 11B and thus can eliminate the possibility of damaging the display element layer 11B with the laser passing through.

Thus, when a capacitor functions as a capacitance element and a transmission line to increase the density of pixels, each of two electrode layers having both of the functions is provided with a disconnectable portion at a predetermined position, which enables the structure having no limitation on a portion where a defective portion in the capacitor can be disconnected in repairing. Thus, even when the short-circuited defective portion is repaired with the disconnection, the capacitor can maintain the conductivity as a transmission line and the capacitance function. Thus, a defective luminescent pixel including a short-circuited capacitor can produce a luminescence with proper luminescent timing, and the display quality of the luminescent panel can be improved, even when the density of pixels increases.

Figure 5A:
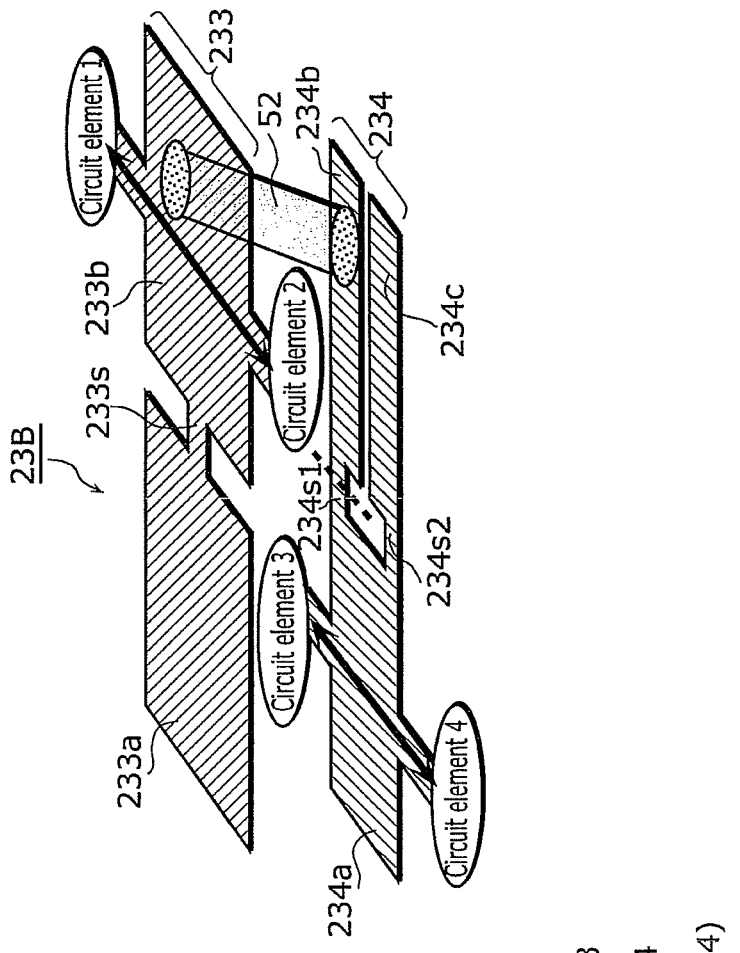
FIG. 5A illustrates a top perspective view of an electrode structural diagram of a capacitor according to Modification 1 of Embodiment 1 of the present invention.
Figure 5B:
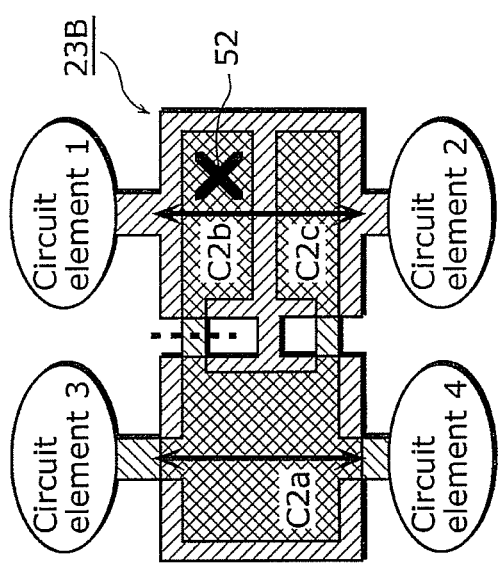
FIG. 5B illustrates a perspective view of an electrode structural diagram of a capacitor according to Modification 1 of Embodiment 1 of the present invention.

FIG. 5A illustrates a top perspective view of an electrode structural diagram of a capacitor 23B according to Modification 1 of Embodiment 1. FIG. 5B illustrates a perspective view of the electrode structural diagram of the capacitor 23B according to Modification 1 of Embodiment 1. The capacitor 23B in FIGS. 5A and 5B is different from the capacitor 23A in FIGS. 3A and 3B by the structure of the capacitor electrodes having no transmission-line function and of the disconnectable portion. The description of the same points as the capacitor 23A will be omitted, and the differences will be mainly described hereinafter.

The capacitor 23B in FIGS. 5A and 5B is an example of the capacitor 23 in FIG. 2, and includes an upper electrode layer 233, a lower electrode layer 234, and an insulating layer (not illustrated) formed between the upper electrode layer 233 and the lower electrode layer 234.

The upper electrode layer 233 includes upper capacitor electrodes 233a and 233b, and a disconnectable portion 233s that are coplanar. The upper capacitor electrode 233a is connected to the upper capacitor electrode 233b through the disconnectable portion 233s that is the first disconnectable portion. Furthermore, the lower electrode layer 234 includes lower capacitor electrodes 234a, 234b, and 234c, and disconnectable portions 234s1 and 234s2 that are coplanar. The lower capacitor electrode 234a that is a first lower capacitor electrode is connected to the lower capacitor electrode 234b that is a second lower capacitor electrode through the disconnectable portion 234s1 that is a second disconnectable portion. Furthermore, the lower capacitor electrode 234a is connected to the lower capacitor electrode 234c that is a third lower capacitor electrode, through the disconnectable portion 234s2 that is a fourth disconnectable portion.

The upper capacitor electrode 233b functions not only as one of two facing electrodes of the capacitor 23B but also as a transmission line that connects a circuit element 1 that is a first circuit element to a circuit element 2 that is a second circuit element. Furthermore, the lower capacitor electrode 234a functions not only as one of the two facing electrodes of the capacitor 23B but also a transmission line that connects a circuit element 3 that is a third circuit element to a circuit element 4 that is a fourth circuit element.

Furthermore, the disconnectable portion 233s included in the upper electrode layer 233 is formed in an area excluding an area where the lower capacitor electrodes 234a, 234b, and 234c and the disconnectable portions 234s1 and 234s2 included in the lower electrode layer 234 are projected in the layer-stacking direction. Similarly, the disconnectable portions 234s1 and 234s2 included in the lower electrode layer 234 are formed in an area excluding an area where the upper capacitor electrodes 233a and 233b and the disconnectable portion 233s included in the upper electrode layer 233 are projected in the layer-stacking direction. Thereby, when one of the disconnectable portions 233s, 234s1, and 234s2 is irradiated with a laser, it is possible to prevent damage on the upper capacitor electrodes 233a and 233b, the lower capacitor electrodes 234a, 234b, and 234c, and the rest of the disconnectable portions that are not disconnected, among the constituent elements of the capacitor 23B. Thus, although the capacitance of the capacitor 23B is reduced by the area proportion of the disconnected electrodes, the capacitor 23B can hold a voltage corresponding to a signal voltage provided through a corresponding data line and causes the luminescent elements to produce luminescences with proper luminescent timing.

With the structure, as illustrated in FIG. 5A, the capacitor 23B including normal pixels can hold a predetermined capacitance C2a between the upper capacitor electrode 233a and the lower capacitor electrode 234a, a predetermined capacitance C2b between the upper capacitor electrode 233b and the lower capacitor electrode 234b, and a predetermined capacitance C2c between the upper capacitor electrode 233b and the lower capacitor electrode 234c.

Furthermore, FIGS. 5A and 5B also illustrate an example that the capacitor 23B included in the luminescent pixel 11 has a short circuit 52 between the upper capacitor electrode 233b and the lower capacitor electrode 234b. Thereby, the charge that should be accumulated in the capacitor 23B with application of the voltage between the upper electrode layer 233 and the lower electrode layer 234 is not held due to the short circuit 52. In this case, disconnecting the disconnectable portion 234s1 by laser irradiation for such a defective luminescent pixel can maintain the capacitance between (i) the upper capacitor electrode 233a and the lower capacitor electrode 234a and (ii) the upper capacitor electrode 233b and the lower capacitor electrode 234c, and the transmission-line function of connecting the circuit elements 1 to 2 and the circuit elements 3 to 4. Thereby, each portion of the lower and upper electrodes of the capacitor 23B can be effectively used as a transmission line, and the density of pixels can be further increased Thus, although the capacitance of the repaired capacitor 23B is reduced by the area proportion of the disconnected electrodes from the original capacitance (C2a+C2b+C2c), resulting in the capacitance (C2a+C2c), the capacitor 23B can hold a voltage corresponding to a signal voltage provided through a corresponding data line and causes the display element layer 11B to produce a luminescence with proper luminescent timing. In other words, compared with the capacitor 23A having one of the two facing electrodes divided into two electrodes, the capacitor 23B can maintain the characteristics as the transmission line even after being repaired by disconnecting one of the divided three electrodes. Thus, a difference between the capacitance of the repair-free capacitor 23B and the capacitance of the repaired capacitor 23B is smaller than a difference between the capacitance of the repair-free capacitor 23A and the capacitance of the repaired capacitor 23A.

Instead of the short circuit 52 in FIGS. 5A and 5B, when a short-circuit failure occurs between the upper capacitor electrode 233a and the lower capacitor electrode 234a, disconnecting the disconnectable portion 233s by laser irradiation for such a defective luminescent pixel can maintain the capacitance between (i) the upper capacitor electrode 233b and the lower capacitor electrode 234b and (ii) the upper capacitor electrode 233b and the lower capacitor electrode 234c, and the transmission-line function of connecting the circuit elements 1 to 2 and the circuit elements 3 to 4.

Furthermore, when a short-circuit failure occurs between the upper capacitor electrode 233b and the lower capacitor electrode 234c, disconnecting the disconnectable portion 234s2 by laser irradiation for such a defective luminescent pixel can maintain the capacitance between (i) the upper capacitor electrode 233a and the lower capacitor electrode 234a and (ii) the upper capacitor electrode 233b and the lower capacitor electrode 234b, and the transmission-line function of connecting the circuit elements 1 to 2 and the circuit elements 3 to 4.

Furthermore, even when the upper capacitor electrode facing the lower capacitor electrode 234b includes two upper capacitor electrodes, instead of the case where the lower capacitor electrode facing the upper capacitor electrode 233b includes the lower capacitor electrodes 234b and 234c, such a capacitor has the same advantages as the capacitor 23B in FIGS. 5A and 5B.

Furthermore, even when the lower capacitor electrode facing the upper capacitor electrode 233b includes the lower capacitor electrodes 234b and 234c and the upper capacitor electrode facing the lower capacitor electrode 234a includes two upper capacitor electrodes, such a capacitor has the same advantages as the capacitor 23B in FIGS. 5A and 5B.

In other words, the capacitor according to Modification 1 of Embodiment 1 includes at least one of: the lower capacitor electrodes 234b and 234c facing the upper capacitor electrode 233b; and two upper capacitor electrodes facing the lower capacitor electrode 234a.

Figure 6A:
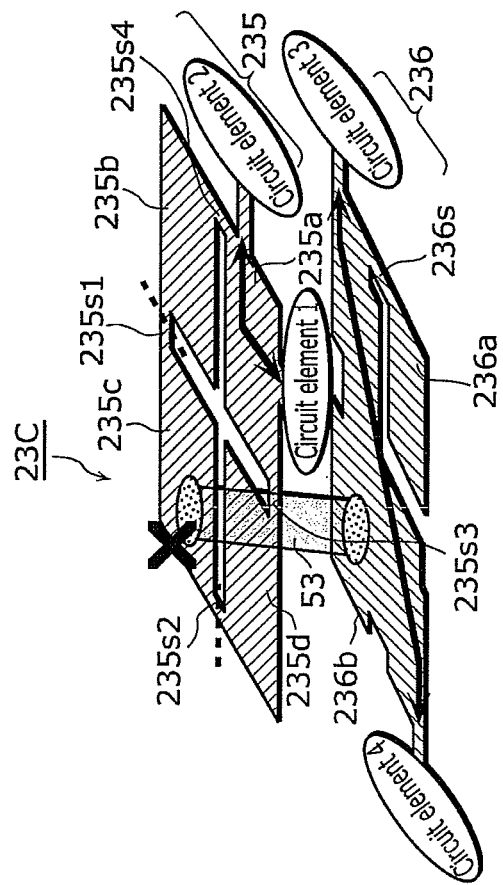
FIG. 6A illustrates a top perspective view of an electrode structural diagram of a capacitor according to Modification 2 of Embodiment 1 of the present invention.
Figure 6B:
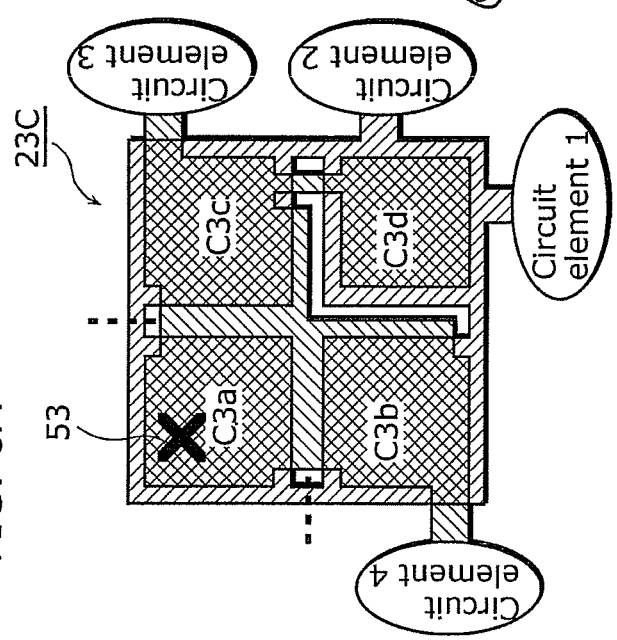
FIG. 6B illustrates a perspective view of an electrode structural diagram of a capacitor according to Modification 2 of Embodiment 1 of the present invention.

FIG. 6A illustrates a top perspective view of an electrode structural diagram of a capacitor 23C according to Modification 2 of Embodiment 1 of the present invention. FIG. 6B illustrates a perspective view of the electrode structural diagram of the capacitor 23C according to Modification 2 of Embodiment 1. The capacitor 23C in FIGS. 6A and 6B is different from the capacitor 23B in FIGS. 5A and 5B by the structure of the capacitor electrode not functioning as a transmission line and of the disconnectable portion. The description of the same points as the capacitor 23B will be omitted, and the differences will be mainly described hereinafter.

The capacitor 23C in FIGS. 6A and 6B is an example of the capacitor 23 in FIG. 2, and includes an upper electrode layer 235, a lower electrode layer 236, and an insulating layer (not illustrated) formed between the upper electrode layer 235 and the lower electrode layer 236.

The upper electrode layer 235 includes upper capacitor electrodes 235a, 235b, 235c, and 235d, and disconnectable portions 235s1, 235s2, 235s3, and 235s4 that are coplanar. The upper capacitor electrode 235a that is a first upper capacitor electrode is connected to the upper capacitor electrode 235b that is a second upper capacitor electrode, through the disconnectable portion 235s4 that is a first disconnectable portion, the upper capacitor electrode 235a is connected to the upper capacitor electrode 235d that is a third upper capacitor electrode, through the disconnectable portion 235s3 that is a third disconnectable portion, the upper capacitor electrode 235b is connected to the upper capacitor electrode 235c that is a fourth upper capacitor electrode through the disconnectable portion 235s1 that is a fifth disconnectable portion, and the upper capacitor electrode 235d is connected to the upper capacitor electrode 235c through the disconnectable portion 235s2 that is a sixth disconnectable portion. Furthermore, the lower electrode layer 236 includes lower capacitor electrodes 236a and 236b, and a disconnectable portion 236s that are coplanar. The lower capacitor electrode 236b that is a first lower capacitor electrode is connected to the lower capacitor electrode 236a that is a second lower capacitor electrode, through the disconnectable portion 236s that is a second disconnectable portion.

The upper capacitor electrode 235a functions not only as one of two facing electrodes of the capacitor 23C but also as a transmission line that connects a circuit element 1 that is a first circuit element to a circuit element 2 that is a second circuit element. Furthermore, the lower capacitor electrode 236b functions not only as one of the two facing electrodes of the capacitor 23C but also as a transmission line that connects a circuit element 3 that is a third circuit element to a circuit element 4 that is a fourth circuit element.

Furthermore, the disconnectable portions 235s1 to 235s4 included in the upper electrode layer 235 are formed in an area excluding an area where the lower capacitor electrodes 236a and 236b and the disconnectable portion 236s included in the lower electrode layer 236 are projected in the layer-stacking direction. Similarly, the disconnectable portion 236s included in the lower electrode layer 236 is formed in an area excluding an area where the upper capacitor electrodes 235a to 235d and the disconnectable portions 235s1 to 235s4 included in the upper electrode layer 235 are projected in the layer-stacking direction. Thereby, when one of the disconnectable portions 235s1 to 235s4 and 236s is irradiated with a laser, it is possible to prevent damage on the upper capacitor electrodes 235a to 235d, the lower capacitor electrodes 236a and 236b, and the rest of the disconnectable portions that are not disconnected, among the constituent elements of the capacitor 23C. Thus, although the capacitance of the capacitor 23C is reduced by the area proportion of the disconnected electrodes, the capacitor 23C can hold a voltage corresponding to a signal voltage provided through a corresponding data line and causes the luminescent elements to produce luminescences with proper luminescent timing.

With the structure, as illustrated in FIG. 6A, the capacitor 23C including normal pixels can hold a predetermined capacitance C3d between the upper capacitor electrode 235a and the lower capacitor electrode 236a, a predetermined capacitance C3c between the upper capacitor electrode 235b and the lower capacitor electrode 236b, a predetermined capacitance C3a between the upper capacitor electrode 235c and the lower capacitor electrode 236b, and a predetermined capacitance C3b between the upper capacitor electrode 235d and the lower capacitor electrode 236b.

Furthermore, FIGS. 6A and 6B also illustrate an example that the capacitor 23C included in the luminescent pixel 11 has a short circuit 53 between the upper capacitor electrode 235c and the lower capacitor electrode 236b. Thereby, the charge that should be accumulated in the capacitor 23C with application of the voltage between the upper electrode layer 235 and the lower electrode layer 236 is not held due to the short circuit 53. In this case, disconnecting the disconnectable portions 235s1 and 235s2 by laser irradiation for such a defective luminescent pixel can maintain the capacitance between (i) the upper capacitor electrode 235a and the lower capacitor electrode 236a, (ii) the upper capacitor electrode 235b and the lower capacitor electrode 236b, and (iii) the upper capacitor electrode 235d and the lower capacitor electrode 236b, and the transmission-line function of connecting the circuit elements 1 to 2 and the circuit elements 3 to 4. Thereby, each portion of the lower and upper electrodes of the capacitor 23C can be effectively used as a transmission line, and the density of pixels can be further increased.

Thus, although the capacitance of the repaired capacitor 23C is reduced by the area proportion of the disconnected electrodes from the original capacitance (C3a+C3b+C3c+C3d), resulting in the capacitance (C3b+C3c+C3d), the capacitor 23C can hold a voltage corresponding to a signal voltage provided through a corresponding data line and causes the display element layer 11B to produce a luminescence with proper luminescent timing. In other words, compared with the capacitor 23B having one of two facing electrodes divided into three electrodes, the capacitor 23C can maintain the characteristics as the transmission line even after being repaired by disconnecting one of the divided four electrodes. Thus, a difference between the capacitance of the repair-free capacitor 23C and the capacitance of the repaired capacitor 23C is smaller than a difference between the capacitance of the repair-free capacitor 23B and the capacitance of the repaired capacitor 23B.

Instead of the short circuit 53 in FIGS. 6A and 6B, the disconnectable portions 235s4 and 235s1 are disconnected by laser irradiation when a short-circuit failure occurs between the upper capacitor electrode 235b and the lower capacitor electrode 236b, or the disconnectable portions 235s2 and 235s3 are disconnected by laser irradiation when a short-circuit failure occurs between the upper capacitor electrode 235d and the lower capacitor electrode 236b, for such a defective luminescent pixel, which can maintain the capacitance between the upper capacitor electrode layer 235 and the lower capacitor electrode layer 236, and the transmission-line function of connecting the circuit elements 1 to 2 and the circuit elements 3 to 4.

Instead of the short circuit 53 in FIGS. 6A and 6B, when a short-circuit failure occurs between the upper capacitor electrode 235a and the lower capacitor electrode 236a, disconnecting the disconnectable portion 236s by laser irradiation for such a defective luminescent pixel can maintain the capacitance between the upper capacitor electrode layer 235 and the lower capacitor electrode layer 236, and the transmission-line function of connecting the circuit elements 1 to 2 and the circuit elements 3 to 4.

Furthermore, even when the lower capacitor electrode 236b includes three lower capacitor electrodes, instead of the case where the upper capacitor electrode facing the lower capacitor electrode 236b includes the upper capacitor electrodes 235b, 235c and 235d, such a capacitor has the same advantages as the capacitor 23C in FIGS. 6A and 6B.

Furthermore, even when the upper capacitor electrode facing the lower capacitor electrode 236b includes the upper capacitor electrodes 235b, 235c and 235d, and the lower capacitor electrode 236b includes three lower capacitor electrodes, such a capacitor has the same advantages as the capacitor 23C in FIGS. 6A and 6B.

In other words, the capacitor 23C according to Modification 2 of Embodiment 1 includes at least one of: the upper capacitor electrode facing the lower capacitor electrode 236b and including the upper capacitor electrodes 235b, 235c, and 235d; and the lower capacitor electrode 236b including three lower capacitor electrodes.

Figure 7A:
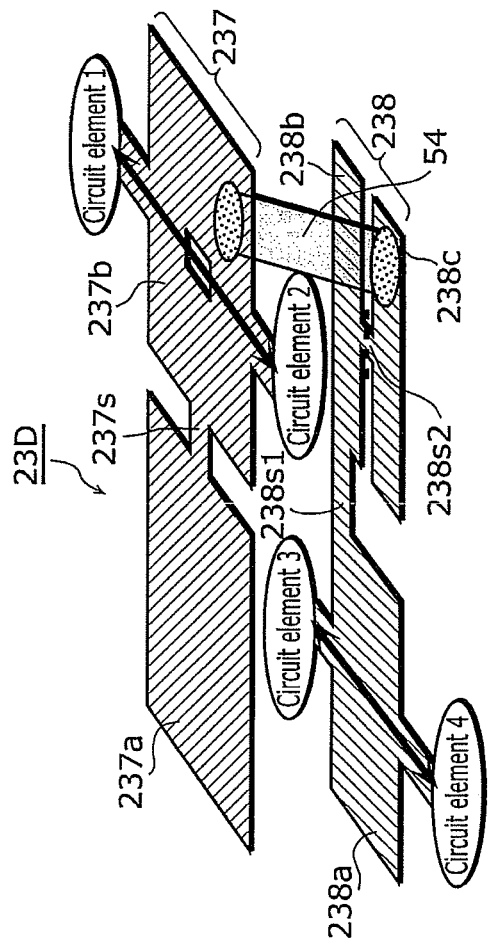
FIG. 7A illustrates a top perspective view of an electrode structural diagram of a capacitor according to Modification 3 of Embodiment 1 of the present invention.
Figure 7B:
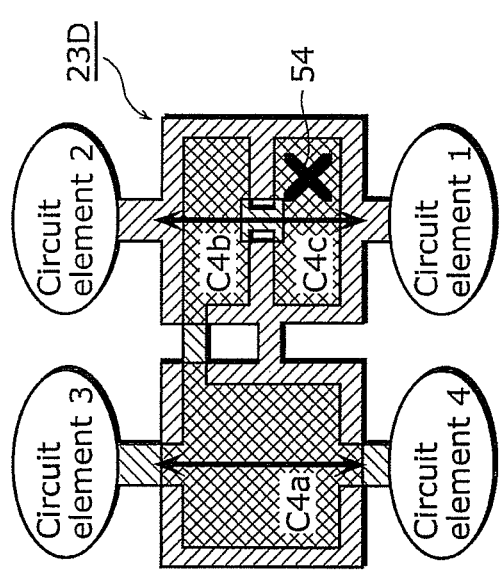
FIG. 7B illustrates a perspective view of an electrode structural diagram of a capacitor according to Modification 3 of Embodiment 1 of the present invention.

FIG. 7A illustrates a top perspective view of an electrode structural diagram of a capacitor 23D according to Modification 3 of Embodiment 1 of the present invention. FIG. 7B illustrates a perspective view of the electrode structural diagram of the capacitor 23D according to Modification 3 of Embodiment 1. The capacitor 23D in FIGS. 7A and 7B is different from the capacitor 23B in FIGS. 5A and 5B by the structure of the disconnectable portion. The description of the same points as the capacitor 23B will be omitted, and the differences will be mainly described hereinafter.

The capacitor 23D in FIGS. 7A and 7B is an example of the capacitor 23 in FIG. 2, and includes an upper electrode layer 237, a lower electrode layer 238, and an insulating layer (not illustrated) formed between the upper electrode layer 237 and the lower electrode layer 238.

The upper electrode layer 237 includes upper capacitor electrodes 237a and 237b, and a disconnectable portion 237s that are coplanar. The upper capacitor electrode 237a is connected to the upper capacitor electrode 237b through the disconnectable portion 237s that is the first disconnectable portion. Furthermore, the lower electrode layer 238 includes lower capacitor electrodes 238a, 238b, and 238c, and disconnectable portions 238s1 and 238s2 that are coplanar. The lower capacitor electrode 238a that is a first lower capacitor electrode is connected to the lower capacitor electrode 238b that is a second lower capacitor electrode, through the disconnectable portion 238s1 that is a second disconnectable portion. Furthermore, the lower capacitor electrode 238b is connected to the lower capacitor electrode 238c that is a third lower capacitor electrode, through the disconnectable portion 238s2 that is a fourth disconnectable portion.

The upper capacitor electrode 237b functions not only as one of two facing electrodes of a capacitor but also a transmission line that connects a circuit element 1 that is a first circuit element to a circuit element 2 that is a second circuit element. Furthermore, the lower capacitor electrode 238a functions not only as one of two facing electrodes of the capacitor 23D but also as a transmission line that connects a circuit element 3 that is a third circuit element to a circuit element 4 that is a fourth circuit element.

Furthermore, the disconnectable portion 237s included in the upper electrode layer 237 is formed in an area excluding an area where the lower capacitor electrodes 238a, 238b, and 238c and the disconnectable portions 238s1 and 238s2 included in the lower electrode layer 238 are projected in the layer-stacking direction. Similarly, the disconnectable portions 238s1 and 238s2 included in the lower electrode layer 238 are formed in an area excluding an area where the upper capacitor electrodes 237a and 237b and the disconnectable portion 237s included in the upper electrode layer 237 are projected in the layer-stacking direction. In particular, the upper capacitor electrode 237b has an opening having a predetermined size in an area facing the disconnectable portion 238s2. Thereby, when one of the disconnectable portions 237s, 238s1, and 238s2 is irradiated with a laser, it is possible to prevent damage on the upper capacitor electrodes 237a and 237b, the lower capacitor electrodes 238a, 238b, and 238c, and the rest of the disconnectable portions that are not disconnected, among the constituent elements of the capacitor 23D. Thus, although the capacitance of the capacitor 23D is reduced by the area proportion of the disconnected electrodes, the capacitor 23D can hold a voltage corresponding to a signal voltage provided through a corresponding data line and causes the luminescent elements to produce luminescences with proper luminescent timing.

With the structure, as illustrated in FIG. 7A, the capacitor 23D including normal pixels can hold a predetermined capacitance C4a between the upper capacitor electrode 237a and the lower capacitor electrode 238a, a predetermined capacitance C4b between the upper capacitor electrode 237b and the lower capacitor electrode 238b, and a predetermined capacitance C4c between the upper capacitor electrode 237b and the lower capacitor electrode 238c.

Furthermore, FIGS. 7A and 7B also illustrate an example that the capacitor 23D included in the luminescent pixel 11 has a short circuit 54 between the upper capacitor electrode 237b and the lower capacitor electrode 238c. Thereby, the charge that should be accumulated in the capacitor 23D with application of the voltage between the upper electrode layer 237 and the lower electrode layer 238 is not held due to the short circuit 54. In this case, disconnecting the disconnectable portion 238s2 by laser irradiation for such a defective luminescent pixel can maintain the capacitance between (i) the upper capacitor electrode 237a and the lower capacitor electrode 238a and (ii) the upper capacitor electrode 237b and the lower capacitor electrode 238b, and the transmission-line function of connecting the circuit elements 1 to 2 and the circuit elements 3 to 4. Thereby, each portion of the lower and upper electrodes of the capacitor 23D can be effectively used as a transmission line, and the density of pixels can be further increased.

Thus, although the capacitance of the repaired capacitor 23D is reduced by the area proportion of the disconnected electrodes from the original capacitance (C4a+C4b+C4c), resulting in the capacitance (C4a+C4b), the capacitor 23D can hold a voltage corresponding to a signal voltage provided through a corresponding data line and causes the display element layer 11B to produce a luminescence with proper luminescent timing. In other words, compared with the capacitor 23A having one of the two facing electrodes divided into two electrodes, the capacitor 23D can maintain the characteristics as the transmission line even after being repaired by disconnecting only one of the divided three electrodes. Thus, a difference between the capacitance of the repair-free capacitor 23D and the capacitance of the repaired capacitor 23D is smaller than a difference between the capacitance of the repair-free capacitor 23A and the capacitance of the repaired capacitor 23A.

Instead of the short circuit 54 in FIGS. 7A and 7B, when a short-circuit failure occurs between the upper capacitor electrode 237b and the lower capacitor electrode 238b, disconnecting the disconnectable portion 238s1 by laser irradiation for such a defective luminescent pixel can maintain the capacitance between the upper capacitor electrode 237b and the lower capacitor electrode 238b, and the transmission-line function of connecting the circuit elements 1 to 2 and the circuit elements 3 to 4.

Instead of the short circuit 54 in FIGS. 7A and 7B, when a short-circuit failure occurs between the upper capacitor electrode 237a and the lower capacitor electrode 238a, disconnecting the disconnectable portion 237s by laser irradiation for such a defective luminescent pixel can maintain the capacitance between (i) the upper capacitor electrode 237b and the lower capacitor electrode 238b and (ii) the upper capacitor electrode 237b and the lower capacitor electrode 238c, and the transmission-line function of connecting the circuit elements 1 to 2 and the circuit elements 3 to 4.

Furthermore, even when the upper capacitor electrode facing the lower capacitor electrode 238b includes two upper capacitor electrodes, instead of the case where the lower capacitor electrode facing the upper capacitor electrode 237b includes the lower capacitor electrodes 238b and 238c, such a capacitor has the same advantages as the capacitor 23D in FIGS. 7A and 7B.

Furthermore, even when the lower capacitor electrode facing the upper capacitor electrode 237b includes the lower capacitor electrodes 238b and 238c and the upper capacitor electrode facing the lower capacitor electrode 238a includes two upper capacitor electrodes, such a capacitor has the same advantages as the capacitor 23D in FIGS. 7A and 7B.

In other words, the capacitor according to Modification 3 of Embodiment 1 includes at least one of: the lower capacitor electrode facing the upper capacitor electrode 237b and including the lower capacitor electrodes 238b and 238c; and the upper capacitor electrode facing the lower capacitor electrode 238a and including two upper capacitor electrodes.

The capacitor electrodes included in the upper electrode layers 231, 233, 235, and 237 and the lower electrode layers 232, 234, 236, and 238 do not have to have the same shape and the same area according to Embodiment 1. Although there is a limitation in the layout of display elements, the shape of the capacitor electrodes is anything.

In order to increase density of pixels according to the increase in the number of luminescent pixels for enhanced-definition of display panels recently required, it is necessary to devise, particularly, a layout of capacitors having a higher area ratio. The effective means is that the capacitors function as both the originally-given capacitance elements and the transmission lines with which circuit elements are connected to each other. Since it is necessary to maintain the conductive characteristics as a transmission line while ensuring a function as a pixel itself, the defective electrodes cannot be disconnected even when the electrodes used also as a transmission line are short-circuited in repairing the capacitor under the conventional structure. In other words, there was a limitation in a portion to be disconnected in the defective portion of a capacitor.

According to the present invention, even when a portion of a transmission line is also used as a capacitor, there is no limitation in the disconnectable portion of the defective portion of a capacitor in repairing. Thus, the characteristics as the transmission line can be always maintained even after the repairing.

Embodiment 2

Embodiment 2 will describe a manufacturing method of a display device according to the present invention. The manufacturing method according to the present invention includes a process of forming a control layer, a process of forming a display element layer, and a process of repairing a capacitor. Hereinafter, processes different from the conventional manufacturing method of a display device, that is, a process of forming a capacitor 23A included in the control layer, and processes of inspecting and repairing a pixel will be mainly described.

Figure 8:
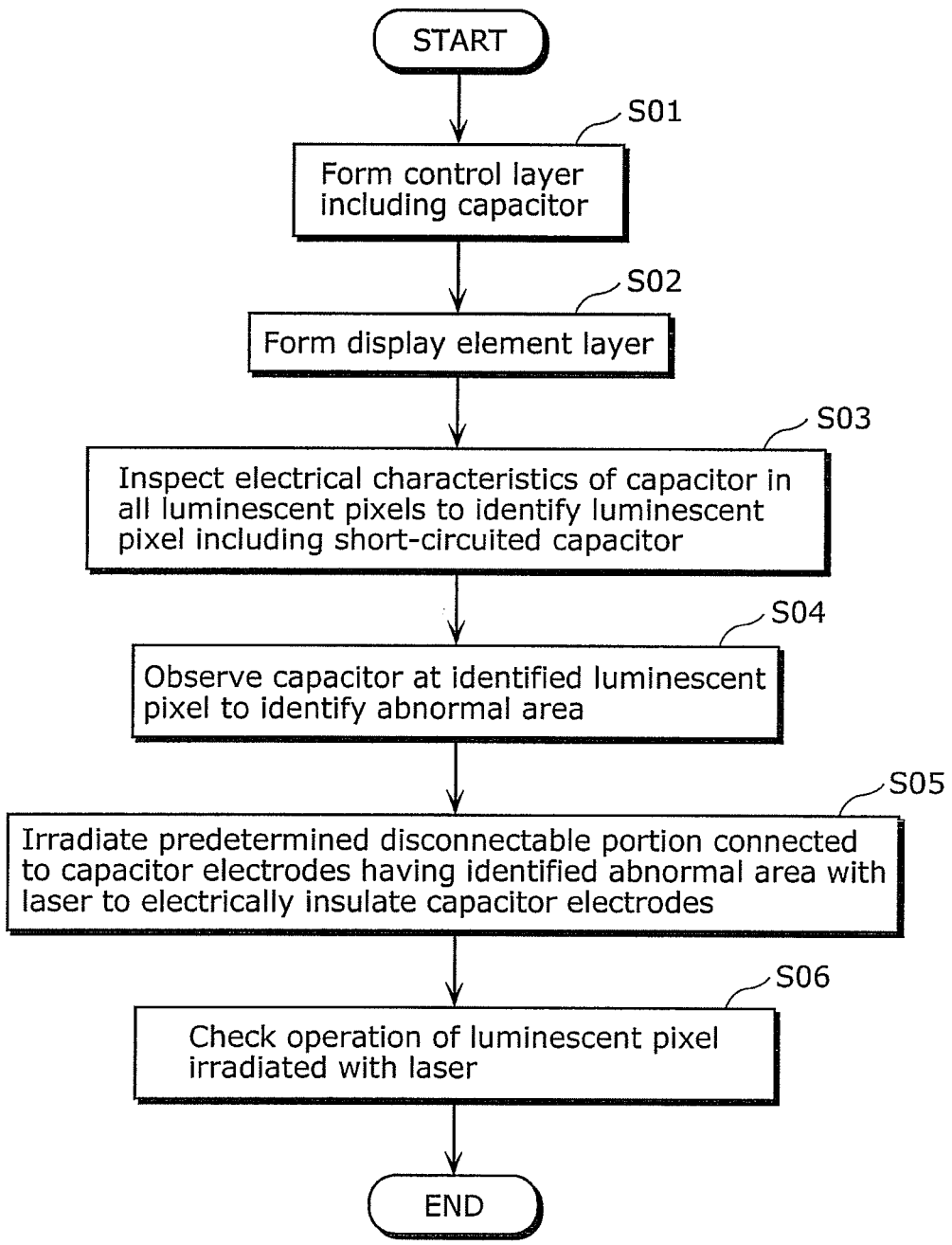
FIG. 8 is an operating flowchart showing a method of manufacturing a display device according to Embodiment 2 of the present invention.

FIG. 8 is an operating flowchart showing a method of manufacturing a display device according to Embodiment 2 of the present invention.

First, a control layer 11A is formed by appropriately laying out the capacitor 23A, a switching transistor 21, a driving transistor 22, a transmission line, and others that are peripheral elements of the capacitor 23A (S01).

More specifically, as a layer of the control layer 11A in FIG. 2, the lower electrode layer 232 made of an alloy of Mo and W, for example, is formed into a shape as illustrated in FIG. 3B, using a technique such as metal-mask film formation, liftoff technique, or etching. Here, the lower electrode layer 232 is formed to connect a source electrode of the switching transistor 21 that is a circuit element 3 to a gate electrode of the driving transistor 22 that is a circuit element 4. Next, an insulating layer made of SiOx or SiN, for example, is formed on the lower electrode layer 232 to cover the lower electrode layer 232. Here, the surface of the insulating layer is preferably flattened as necessary. More specifically, the upper electrode layer 231 having a stacked structure, for example, including: an alloy of Mo and W; aluminum (Al); and an alloy of Mo and W is formed into a shape as illustrated in FIG. 3B, using a technique such as metal-mask film formation, liftoff technique, or etching. Here, the upper electrode layer 231 is formed to connect a power source line 16 that is the circuit element 1 to a drain electrode of the driving transistor 22 that is the circuit element 2. Step S01 corresponds to the forming of the controller.

Next, after a process of flattening the control layer 11A, a display element layer 11B including an organic EL element 24 is formed on the control layer 11A (S02).

More specifically, the display element layer 11B includes, for example, an anode, a hole injection layer, a hole transport layer, an organic luminescent layer, a bank layer, an electron injection layer, and a transparent cathode. Step S02 corresponds to the forming of the display elements.

Next, the electrical characteristics of the capacitors 23A in all the luminescent pixels 11 are inspected to identify a luminescent pixel 11 having a short-circuited capacitor 23A (S03).

More specifically, for example, an array tester (Agilent: HS100) is connected to the data lines 12 and a test voltage is applied to the luminescent pixels 11 sequentially through the data lines 12 such that the test voltage is held in the capacitor 23A. After that, with predetermined timing, the array tester reads the voltage held in the capacitor 23A, through the data lines 12. With this, a luminescent pixel 11 is identified whose read-out voltage is lower than a predetermined voltage. This completes the process of identifying a luminescent pixel having an abnormal capacitor 23A.

Next, the capacitor 23A of the identified luminescent pixel 11 is observed to identify an abnormal area (S04).

More specifically, for example, the area in which the capacitor 23A is formed is microscopically observed to examine whether there is any projection or depression on the surface. The area with uneven distribution of conductive particles usually has a projection. This completes the process of identifying the area of the abnormal capacitor 23A, and abnormal capacitor electrodes are identified. Note that this area identifying process may be performed by an inspecting person or by an automatic measurement system having an image recognition function. Steps S03 and S04 correspond to the inspecting.

Next, a part of a predetermined disconnectable portion connected to the capacitor electrode having the identified abnormal area is irradiated with a laser to electrically insulate the capacitor electrodes from the other capacitor electrodes (S05). Here, the capacitor electrodes including the identified abnormal area are separated from display pixels by preventing the transmission line from being disconnected. More specifically, in the capacitor 23A in FIGS. 3A and 3B, when a short-circuit failure occurs between the upper capacitor electrode 231b that is the first upper capacitor electrode and the lower capacitor electrode 232b that is the second lower capacitor electrode, the disconnectable portion 232s that is the second disconnectable portion is disconnected. When a short-circuit failure occurs between the lower capacitor electrode 232a that is the first lower capacitor electrode and the upper capacitor electrode 231a that is the second upper capacitor electrode, the disconnectable portion 231s that is the first disconnectable portion is disconnected.

The shape that allows disconnection by irradiating a part of a predetermined disconnectable portion with a laser is closely related to the specifications of the laser used. For example, in the case where a laser oscillator having a yttrium aluminum garnet (YAG) laser as the light source is used with a laser having an output parameter of 532 nm in wavelength, 10 ns in pulse width, and 0.5 mW in power, for example, the disconnectable portion can be disconnected without damaging the other normal electrodes, provided that the disconnectable portion is 4 μm in width and 150 nm in thickness. Here, the disconnectable portion has the above-described stacked structure including: an alloy of Mo and W; aluminum (Al); and an alloy of Mo and W, for example. Step S05 corresponds to the disconnecting.

Lastly, the operation of the luminescent pixel 11 irradiated with the laser as above is checked (S06).

With the above manufacturing method, when a capacitor functions as both a transmission line and a capacitance element for increasing the density of pixels, a disconnectable portion where a defective portion can be disconnected from the capacitor can be repaired without any limitation. Thus, even when the short-circuited defective portion is repaired with the disconnection, the capacitor can maintain the conductivity as a transmission line and the capacitance function. Thus, a defective luminescent pixel including a short-circuited capacitor can produce a luminescence with proper luminescent timing, and the display quality of the luminescent panel can be improved, even when the density of pixels increases.

The inspecting at Steps S03 and S04 and the disconnecting at Step S05 may be performed before the forming of the display elements at Step S02. In other words, Steps S03, S04, and S05 may be performed when the upper electrode layer 231 is formed, when the control layer 11A is flattened, or when the display element layer 11B is formed and a sealing process is successively performed.

Embodiment 3

Embodiment 3 will describe a layout structure of luminescent pixels each including the capacitor and other circuit elements included in the control layer 11A according to Embodiment 1, and the advantages will be described.

FIG. 9A is a first layout drawing illustrating luminescent pixels included in a conventional display device. The layout drawing illustrates a layout of one luminescent pixel including a data line 12, a scanning line 13, a switching transistor 21, a driving transistor 22, a capacitor having a capacitance C1, and transmission lines. Furthermore, the switching transistor 21 and the driving transistor 22 are bottom-gate transistors, a layer including a gate electrode is a lower electrode layer, and a layer including a source electrode and a drain electrode is an upper electrode layer. Although the capacitor having a higher area ratio of luminescent pixels and having the capacitance C1 is also used as a transmission line 300 that connects the switching transistor 21 and the driving transistor 22, each of the electrode layers of the capacitor having the capacitance C1 is composed of one capacitor electrode. In this layout, when the capacitor having the capacitance C1 is short-circuited, disconnectable portions 301s1 and 301s2 are to be disconnected. However, in any case, since the capacitance function of the capacitor having the capacitance C1 is lost, it is impossible to restore a defective luminescent pixel to produce a luminescence with proper luminescent timing.

FIG. 9B is a second layout drawing illustrating luminescent pixels included in a conventional display device. The layout drawing is different from that of FIG. 9A in that the upper electrode layer of the capacitor is divided into portions. In this layout, when the capacitor having the capacitance C1 is short-circuited, a disconnectable portion 304s is to be disconnected. Furthermore, when the capacitor having the capacitance C2 is short-circuited, a disconnectable portion 305s is to be disconnected. In either case, although the capacitance of the capacitor decreases by half, it is possible to restore a defective luminescent pixel to produce a luminescence with proper luminescent timing while maintaining the capacitance. However, since the lower electrode layer of the capacitor is not divided, a continuous region as a capacitor is necessary, and the flexibility of the layout of luminescent pixels is limited.

In contrast, when the structure of the capacitor according to the present invention is applied to the layout structure of the luminescent pixels, the capacitance of the repaired luminescent pixels is maintained, the defective luminescent pixel produces a luminescence with proper luminescent timing, and the flexibility of the layout of luminescent pixels is ensured. Thus, the density of pixels can be increased. Compared with the conventional layout in FIG. 9B, the following describes ensuring the flexibility of the layout of luminescent pixels according to the present invention.

FIG. 9C is a first layout drawing illustrating luminescent pixels included in a display device according to the present invention. The layout drawing illustrates a layout of one luminescent pixel including a data line 12, a scanning line 13, a switching transistor 21, a driving transistor 22, a capacitor 23A, and transmission lines. Furthermore, the switching transistor 21 and the driving transistor 22 are bottom-gate transistors, a layer including a gate electrode is a lower electrode layer 232, and a layer including a source electrode and a drain electrode is an upper electrode layer 231. The upper electrode layer 231 included in the capacitor 23A includes upper capacitor electrodes 231a and 231b, and a disconnectable portion 231s for connecting the upper capacitor electrodes 231a and 231b. Furthermore, the upper capacitor electrode 231b is also used as a transmission line 31 that connects the drain electrode of the driving transistor 22 to a power source line (not illustrated). On the other hand, the lower electrode layer 232 included in the capacitor 23A includes lower capacitor electrodes 232a and 232b, and a disconnectable portion 232s for connecting the lower capacitor electrodes 232a and 232b. The lower capacitor electrode 232a is also used as a transmission line 32 that connects the source electrode of the switching transistor 21 to the gate electrode of driving transistor 22. In this layout, when a short-circuit failure occurs between the upper capacitor electrode 231a and lower capacitor electrode 232a, the disconnectable portion 231s is to be disconnected. Furthermore, when a short-circuit failure occurs between the upper capacitor electrode 231b and the lower capacitor electrode 232b, the disconnectable portion 232s is to be disconnected. In either case, although the capacitance of the capacitor decreases by half, the capacitance function is maintained, and it is possible to restore a defective luminescent pixel to produce a luminescence with proper luminescent timing. Furthermore, since each of the upper electrode layer 231 and the lower electrode layer 232 in the capacitor is divided into two portions while maintaining the capacitance function, the capacitor does not need a continuous region. Thus, the flexibility of the layout of luminescent pixels can be ensured, each of the capacitor electrodes included in the capacitors can be laid out at a distance, and a necessary area for the pixels can be reduced. Thereby, the density of the pixels can be increased.

Figure 10A:
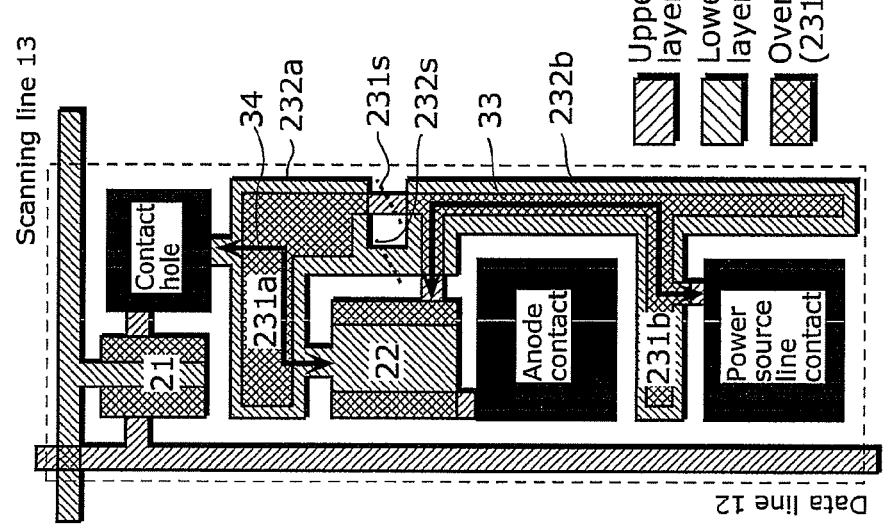
FIG. 10A is a third layout drawing illustrating a luminescent pixel included in a conventional display device.

FIG. 10A is a third layout drawing illustrating a luminescent pixel included in a conventional display device. The layout drawing illustrates a layout of one luminescent pixel when the display device has a higher density of the luminescent pixels and each luminescent pixel is vertically long. Although the upper electrode layer of the capacitor having the capacitance C1 is also used as a transmission line 306 that connects the driving transistor 22 to a power source line 16, each of the electrode layers of the capacitor having the capacitance C1 is composed of one capacitor electrode. With the structure, when a portion where the transmission line 306 is commonly used is short-circuited, the portion cannot be repaired. Furthermore, as a luminescent pixel is smaller and the shape of the luminescent pixel is vertically longer, it is highly likely that the transmission line 306 is commonly used and the portion cannot be repaired.

In contrast, when the structure of the capacitor according to the present invention is applied to the layout structure of the vertically-long luminescent pixels, the capacitance function of the repaired luminescent pixels is maintained, the defective luminescent pixel is restored to produce a luminescence with proper luminescent timing, and the flexibility of the layout of luminescent pixels is ensured. Thus, the density of pixels can be increased.

Figure 10B:
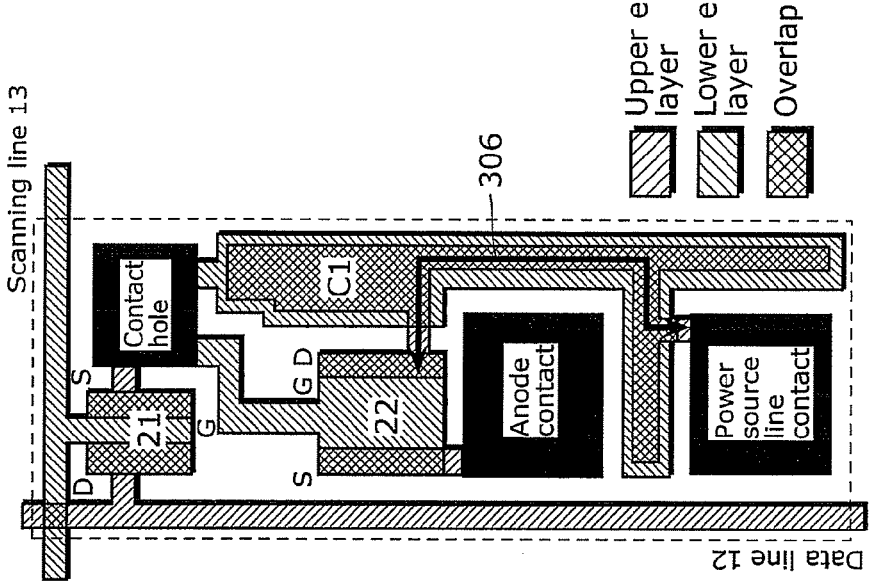
FIG. 10B is a second layout drawing illustrating a luminescent pixel included in a display device according to the present invention.

FIG. 10B is a second layout drawing illustrating a luminescent pixel included in a display device according to the present invention. The layout drawing illustrates a layout of one luminescent pixel when the display device has a higher density of the luminescent pixels and each luminescent pixel is vertically long. Furthermore, the switching transistor 21 and the driving transistor 22 are bottom-gate transistors, a layer including a gate electrode is a lower electrode layer 232, and a layer including a source electrode and a drain electrode is an upper electrode layer 231. The upper electrode layer 231 included in the capacitor 23A includes upper capacitor electrodes 231a and 231b, and a disconnectable portion 231s for connecting the upper capacitor electrodes 231a and 231b. Furthermore, the upper capacitor electrode 231b is also used as a transmission line 33 that connects the drain electrode of the driving transistor 22 to a power source line (not illustrated). On the other hand, the lower electrode layer 232 included in the capacitor 23A includes the lower capacitor electrodes 232a and 232b, and a disconnectable portion 232s for connecting the lower capacitor electrodes 232a and 232b. The lower capacitor electrode 232a is also used as a transmission line 34 that connects the source electrode of the switching transistor 21 and the gate electrode of driving transistor 22. In this layout, when a short-circuit failure occurs between the upper capacitor electrode layer and the lower capacitor electrode layer, one of the disconnectable portions is selected and disconnected as in the capacitor in FIG. 9C. Thereby, even when the display device has a higher density of the luminescent pixels and each luminescent pixel is vertically long, the capacitance function is maintained, and it is possible to restore a defective luminescent pixel to produce a luminescence with proper luminescent timing. According to the present invention, luminescent pixels having any shape can increase the density.

FIG. 11A is a third layout drawing illustrating a luminescent pixel included in a display device according to the present invention. The layout drawing illustrates a layout of one luminescent pixel including a data line 12, a scanning line 13, a switching transistor 21, a driving transistor 22, a capacitor 23A, and transmission lines. Furthermore, the switching transistor 21 and the driving transistor 22 are bottom-gate transistors, a layer including a gate electrode is a lower electrode layer 232, and a layer including a source electrode and a drain electrode is an upper electrode layer 231. The layout drawing in FIG. 11A is different from the layout drawing in FIG. 10B in that an electrode included in the driving transistor 22 is inserted between the lower capacitor electrodes 232a and 232b divided from the lower electrode layer 232.

The upper electrode layer 231 included in the capacitor 23A includes upper capacitor electrodes 231a and 231b, and a disconnectable portion 231s for connecting the upper capacitor electrodes 231a and 231b. Furthermore, the upper capacitor electrode 231b is also used as a transmission line 35 that connects the drain electrode of the driving transistor 22 and a power source line (not illustrated). On the other hand, the lower electrode layer 232 included in the capacitor 23A includes lower capacitor electrodes 232a and 232b, and a disconnectable portion 232s for connecting the lower capacitor electrodes 232a and 232b. The lower capacitor electrode 232a is also used as a transmission line 36 that connects the source electrode of the switching transistor 21 and the gate electrode of driving transistor 22. Furthermore, a gate metal layer that is an electrode included in a driving transistor is inserted between the disconnectable portion 232s and the lower capacitor electrode 232a. In this layout, when a short-circuit failure occurs between the upper capacitor electrode layer and the lower capacitor electrode layer, one of the disconnectable portions is selected and disconnected as in the capacitor in FIG. 9C.

According to the layout in FIG. 11A, not only each of the upper electrode layer 231 and the lower electrode layer 232 in the capacitor are divided into two portions while maintaining the capacitance function, but also the electrode included in a circuit element is inserted on a connection path of the capacitor electrodes divided into two. Thus, compared with the layout of the luminescent pixel in FIGS. 9C and 10B, the flexibility of the layout is ensured, and a necessary area for the pixels can be reduced. Thereby, the density of the pixels can be increased.

FIG. 11B is a fourth layout drawing illustrating a luminescent pixel included in a display device according to the present invention. The layout drawing illustrates a layout of one luminescent pixel including a data line 12, a scanning line 13, a switching transistor 21, a driving transistor 22, a capacitor 23A, and transmission lines. Furthermore, the switching transistor 21 and the driving transistor 22 are bottom-gate transistors, a layer including a gate electrode is a lower electrode layer 232, and a layer a source electrode and a drain electrode is an upper electrode layer 231. The layout drawing in FIG. 11B is different from the layout drawing in FIG. 10B in that an electrode included in the driving transistor 22 is inserted between the upper capacitor electrodes 231a and 231b divided from the upper electrode layer 231.

The upper electrode layer 231 included in the capacitor 23A includes upper capacitor electrodes 231a and 231b, and a disconnectable portion 231s for connecting the upper capacitor electrodes 231a and 231b. Furthermore, the upper capacitor electrode 231b is also used as a transmission line 37 that connects the drain electrode of the driving transistor 22 to a power source line (not illustrated). Furthermore, a drain metal layer that is an electrode included in a driving transistor is inserted between the disconnectable portion 231s and the upper capacitor electrode 231b. On the other hand, the lower electrode layer 232 included in the capacitor 23A includes lower capacitor electrodes 232a and 232b, and a disconnectable portion 232s for connecting the lower capacitor electrodes 232a and 232b. The lower capacitor electrode 232a is also used as a transmission line 38 that connects the source electrode of the switching transistor 21 and the gate electrode of driving transistor 22. In this layout, when a short-circuit failure occurs between the upper capacitor electrode layer and the lower capacitor electrode layer, one of the disconnectable portions is selected and disconnected as in the capacitor in FIG. 9C.

According to the layout in FIG. 11B, not only each of the upper electrode layer 231 and the lower electrode layer 232 in the capacitor is divided into two portions while maintaining the capacitance function, but also the electrode included in a circuit element is inserted on a connection path of the capacitor electrodes divided into two. Thus, compared with the layout of the luminescent pixel in FIGS. 9C and 10B, the flexibility of the layout is ensured, and a necessary area for the pixels can be reduced. Thereby, the density of the pixels can be increased.

FIG. 11C is a fifth layout drawing illustrating a luminescent pixel included in a display device according to the present invention. The layout drawing illustrates a layout of one luminescent pixel including a data line 12, a scanning line 13, a switching transistor 21, a driving transistor 22, a capacitor 23A, and transmission lines. Furthermore, the switching transistor 21 and the driving transistor 22 are bottom-gate transistors, a layer including a gate electrode is a lower electrode layer 232, and a layer including a source electrode and a drain electrode is an upper electrode layer 231. The layout drawing in FIG. 11C is different from the layout drawing in FIG. 10B in that an electrode included in the driving transistor 22 is inserted between the upper capacitor electrodes 231a and 231b divided from the upper electrode layer 231, and is inserted between the lower capacitor electrodes 232a and 232b divided from the lower electrode layer 232.

The upper electrode layer 231 included in the capacitor 23A includes the upper capacitor electrodes 231a and 231b, and a disconnectable portion 231s for connecting the upper capacitor electrodes 231a and 231b. Furthermore, the upper capacitor electrode 231b is also used as a transmission line 39 that connects the drain electrode of the driving transistor 22 and a power source line (not illustrated). Furthermore, a drain metal layer that is an electrode included in a driving transistor is inserted between the disconnectable portion 231s and the upper capacitor electrode 231b. On the other hand, the lower electrode layer 232 included in the capacitor 23A includes the lower capacitor electrodes 232a and 232b, and a disconnectable portion 232s for connecting the lower capacitor electrodes 232a and 232b. The lower capacitor electrode 232a is also used as a transmission line 40 that connects the source electrode of the switching transistor 21 and the gate electrode of the driving transistor 22. Furthermore, a gate metal layer that is an electrode included in a driving transistor is inserted between the disconnectable portion 232s and the lower capacitor electrode 232a. In this layout, when a short-circuit failure occurs between the upper capacitor electrode layer and the lower capacitor electrode layer, one of the disconnectable portions is selected and disconnected as in the capacitor in FIG. 9C.

According to the layout in FIG. 11C, not only each of the upper electrode layer 231 and the lower electrode layer 232 in the capacitor is divided into two portions while maintaining the capacitance function, but also the electrode included in a circuit element is inserted on a connection path of the capacitor electrodes divided into two. Thus, compared with the layout of the luminescent pixel in FIGS. 9C and 10B, the flexibility of the layout is ensured, and a necessary area for the pixels can be reduced. Thereby, the density of the pixels can be increased.

Although the display device and the method of manufacturing the same are described based on Embodiments, the display device and the method of manufacturing the same are not limited to those in Embodiments. Furthermore, the present invention also includes another embodiment obtained by combining any constituent elements according to Embodiments 1 to 3, a modification of Embodiments conceivable by those skilled in the art without materially departing from the novel teachings and advantages of the present invention, and various apparatuses including the display device according to the present invention.

For example, although Embodiment 2 describes the method of manufacturing the display device including the capacitor 23A in FIGS. 3A and 3B, the method of manufacturing the display device according to Embodiment 2 is also applied to the capacitors 23B, 23C, and 23D according to Modifications 1 to 3 of Embodiment 1.

Furthermore, although Embodiment 3 describes the layout of the luminescent pixel included in the capacitor 23A in FIGS. 3A and 3B, the layout of the luminescent pixel according to Embodiment 3 is applicable to the capacitors 23B, 23C, and 23D according to Modifications 1 to 3 of Embodiment 1.

Furthermore, although Embodiment 1 describes an example of dividing at least one of the upper electrode layer and the lower electrode layer that is included in the capacitor 23 into four at a maximum, the number of the capacitor electrodes may be any number as long as it is two or more in light of the percent defective of the luminescent pixels 11 and a necessary capacitance.

Furthermore, although Embodiments 1 to 3 describe a short circuit occurring due to particles or others between electrodes as a reason of defects in the capacitor, the short circuit according to Embodiments 1 to 3 is not limited to a dead short circuit. For example, the short circuit also includes a state where the resistance value or the capacitance value is very small as in the case of a point contact between particles.

Figure 12:
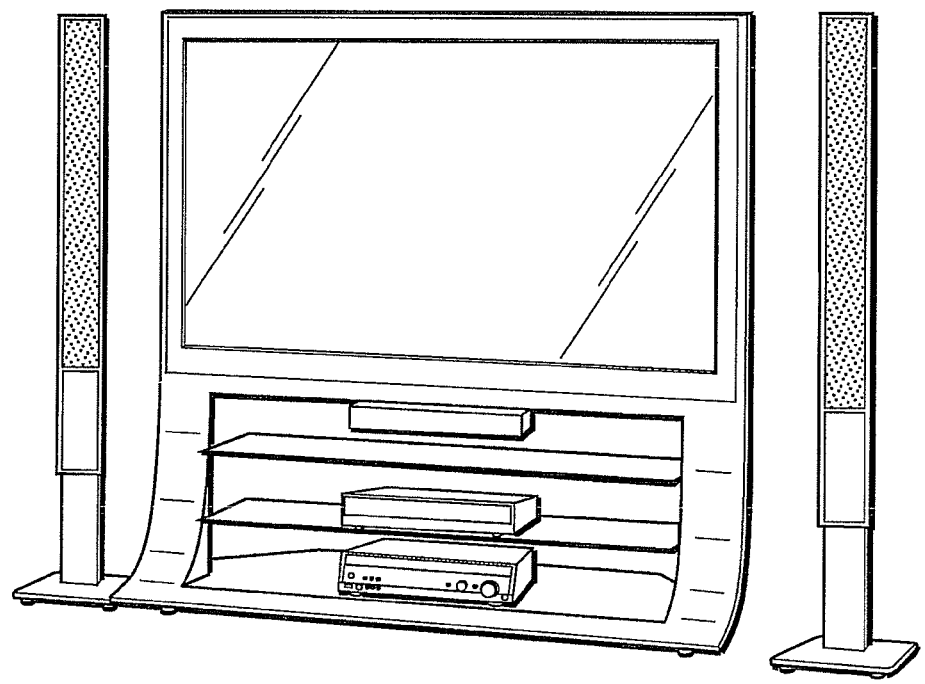
FIG. 12 is an external view of a thin flat TV including an image display device according to the present invention.

Furthermore, the image display device according to the present invention is included in a thin flat TV as shown in FIG. 12, for example. This allows providing a thin flat TV with an enhanced display panel quality and enhanced definition through repairing of a luminescent pixel which does not produce a luminescence with proper luminescent timing.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The image display device and the method of manufacturing the same according to the present invention are useful in such technical fields as thin televisions and personal computer displays for which a large screen and high resolution are demanded.

What is claimed is:

1. A display device, comprising
display pixels that are two-dimensionally arranged, each of the display pixels including stacked layers including a display element layer and a control layer that drives the display element layer,
the control layer including a capacitor including an upper electrode layer and a lower electrode layer that face each other in a layer-stacking direction, the capacitor being a parallel-plate capacitor,
the upper electrode layer including a first upper capacitor electrode, a second upper capacitor electrode, and a first disconnectable portion, the first upper capacitor electrode functioning as a transmission line for connecting a first circuit element to a second circuit element, and the second upper capacitor electrode being connected to the first upper capacitor electrode through the first disconnectable portion and not functioning as a transmission line, and
the lower electrode layer including a first lower capacitor electrode, a second lower capacitor electrode, and a second disconnectable portion, the first lower capacitor electrode functioning as a transmission line for connecting a third circuit element to a fourth circuit element, and the second lower capacitor electrode being connected to the first lower capacitor electrode through the second disconnectable portion and not functioning as a transmission line,
wherein the capacitor holds a predetermined capacitance each between the first upper capacitor electrode and the second lower capacitor electrode, and between the first lower capacitor electrode and the second upper capacitor electrode.

2. The display device according to claim 1,
wherein at least one of the following is true:
i) the upper electrode layer further includes a third upper capacitor electrode and a third disconnectable portion, the third upper capacitor electrode being connected to the first upper capacitor electrode through the third disconnectable portion; and
ii) the lower electrode layer further includes a third lower capacitor electrode and a fourth disconnectable portion, the third lower capacitor electrode being connected to the first lower capacitor electrode through the fourth disconnectable portion, and
wherein the capacitor holds a predetermined capacitance between at least one of: the third upper capacitor electrode and the first lower capacitor electrode; and the third lower capacitor electrode and the first upper capacitor electrode.

3. The display device according to claim 2,
wherein at least one of the following is true:

i) the upper electrode layer further includes a fourth upper capacitor electrode, a fifth disconnectable portion, and a sixth disconnectable portion, the fourth upper capacitor electrode being connected to the second upper capacitor electrode through the fifth disconnectable portion and connected to the third upper capacitor electrode through the sixth disconnectable portion; and ii) the lower electrode layer further includes a fourth lower capacitor electrode, a seventh disconnectable portion, and an eighth disconnectable portion, the fourth lower capacitor electrode being connected to the second lower capacitor electrode through the seventh disconnectable portion and connected to the third lower capacitor electrode through the eighth disconnectable portion, and wherein the capacitor holds a predetermined capacitance between at least one of: the fourth upper capacitor electrode and the first lower capacitor electrode; and the fourth lower capacitor electrode and the first upper capacitor electrode.

4. The display device according to claim 1,
wherein at least one of the following is true:
i) the upper electrode layer further includes a third upper capacitor electrode and a third disconnectable portion, the third upper capacitor electrode being connected to the second upper capacitor electrode through the third disconnectable portion; and ii) the lower electrode layer further includes a third lower capacitor electrode and a fourth disconnectable portion, the third lower capacitor electrode being connected to the second lower capacitor electrode through the fourth disconnectable portion, and wherein the capacitor holds a predetermined capacitance between at least one of: the third upper capacitor electrode and the first lower capacitor electrode; and the third lower capacitor electrode and the first upper capacitor electrode.

5. The display device according to claim 1,
wherein each of the first disconnectable portion and the second disconnectable portion has a shape that allows disconnection by laser irradiation.

6. The display device according to claim 5,
wherein the first disconnectable portion included in the upper electrode layer is formed in an area excluding an area where the first lower capacitor electrode, the second lower capacitor electrode, and the second disconnectable portion that are included in the lower electrode layer are projected in the layer-stacking direction, and the second disconnectable portion included in the lower electrode layer is formed in an area excluding an area where the first upper capacitor electrode, the second upper capacitor electrode, and the first disconnectable portion that are included in the upper electrode layer are projected in the layer-stacking direction.

7. The display device according to claim 1,
wherein the display pixels include the first circuit element, the second circuit element, the third circuit element, and the fourth circuit element, and each of the first circuit element, the second circuit element, the third circuit element, and the fourth circuit element is one of a driver, a switch, a capacitor, a luminescent element, a scanning line, a control line, and a power source line.

8. The display device according to claim 1,
wherein the capacitor is a capacitor having, as a holding voltage, a voltage corresponding to a signal voltage provided for each of the display pixels, the control layer has a gate connected to one of terminals of the capacitor, and includes a driving transistor that converts the holding voltage into a signal current that is a source-to-drain current with application of the holding voltage to the gate, and the display element layer includes a luminescent element that produces a luminescence according to a flow of the signal current.

9. The display device according to claim 8,
wherein the luminescent element is an organic electroluminescence (EL) element.

10. A method of manufacturing a display device including display pixels that are two-dimensionally arranged, each of the display pixels including stacked layers including a display element layer and a control layer that drives the display element layer, said method comprising:

forming a control layer including a capacitor that is a parallel-plate capacitor, the capacitor including an upper electrode layer and a lower electrode layer that face each other in a layer-stacking direction, the upper electrode layer including a first upper capacitor electrode, a second upper capacitor electrode, and a first disconnectable portion, the first upper capacitor electrode connecting a first circuit element to a second circuit element, the second upper capacitor electrode being connected to the first upper capacitor electrode through the first disconnectable portion, the lower electrode layer including a first lower capacitor electrode, a second lower capacitor electrode, and a second disconnectable portion, the first lower capacitor electrode connecting a third circuit element to a fourth circuit element, the second lower capacitor electrode being connected to the first lower capacitor electrode through the second disconnectable portion, and the capacitor holding a predetermined capacitance each between the first upper capacitor electrode and the second lower capacitor electrode, and between the first lower capacitor electrode and the second upper capacitor electrode;

forming the display elements;
inspecting the capacitor formed in the forming of a control layer; and
disconnecting one of: a set of the first upper capacitor electrode and the second lower capacitor electrode; and a set of the first lower capacitor electrode and the second upper capacitor electrode, from the display elements to prevent, from being disconnected, the connection between the first circuit element and the second circuit element and the connection between the third circuit element and the fourth circuit element, the set being included in the capacitor and determined as being short-circuited in the inspecting.

11. The method according to claim 10,
wherein the disconnecting includes:
disconnecting the second disconnectable portion when a short-circuit failure occurs between the first upper capacitor electrode and the second lower capacitor electrode; and disconnecting the first disconnectable portion when a short-circuit failure occurs between the first lower capacitor electrode and the second upper capacitor electrode.

12. The method according to claim 10,
wherein the disconnecting includes
disconnecting the short-circuited set from the display elements by irradiating a corresponding one of the first disconnectable portion and the second disconnectable portion with a laser to prevent, from being disconnected, the connection between the first circuit element and the second circuit element and the connection between the third circuit element and the fourth circuit element.

* * * * *